(12) United States Patent
Wu et al.

(10) Patent No.: US 12,720,780 B2
(45) Date of Patent: Aug. 25, 2026

(54) SCHOTTKY BARRIER DIODE (SBD) LEAKAGE CURRENT BLOCKING STRUCTURE

(71) Applicant: Taiwan Semiconductor Manufacturing Co., Ltd., Hsinchu (TW)

(72) Inventors: Cheng-Hsien Wu, Hsinchu (TW); Chien-Lin Tseng, Zhubei (TW); Sheng Yu Lin, Taoyuan (TW); Ting-Chang Chang, Hsinchu (TW); Yung-Fang Tan, Hsinchu (TW); Yu-Fa Tu, Hsinchu (TW); Wei-Chun Hung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 421 days.

(21) Appl. No.: 18/310,369

(22) Filed: May 1, 2023

(65) Prior Publication Data

US 2024/0178328 A1 May 30, 2024

Related U.S. Application Data

(60) Provisional application No. 63/385,469, filed on Nov. 30, 2022.

(51) Int. Cl.

| | |
|---|---|
| ***H10D 8/60*** | (2025.01) |
| ***H10D 64/64*** | (2025.01) |
| ***H10W 10/00*** | (2026.01) |
| ***H10W 10/10*** | (2026.01) |

(52) U.S. Cl.

CPC ............... *H10D 8/60* (2025.01); *H10D 64/64* (2025.01); *H10W 10/011* (2026.01); *H10W 10/10* (2026.01)

(58) Field of Classification Search

CPC .......... H10D 8/60; H10D 64/64; H10D 8/051; H10D 62/115; H10D 62/105; H01L 21/762

See application file for complete search history.

(56) References Cited

U.S. PATENT DOCUMENTS

| | | | | |
|---|---|---|---|---|
| 9,196,723 | B1 * | 11/2015 | Chen | H10D 30/65 |
| 9,484,454 | B2 * | 11/2016 | Levy | H10D 30/0281 |
| 10,535,551 | B2 * | 1/2020 | Feilchenfeld | H10D 8/60 |
| 10,665,727 | B2 * | 5/2020 | Lo | H10D 8/051 |
| 11,349,010 | B2 * | 5/2022 | Lin | H10D 8/051 |
| 11,469,320 | B2 * | 10/2022 | Kim | H10D 30/603 |
| 11,489,047 | B2 * | 11/2022 | Okamoto | H10D 62/142 |
| 2008/0296722 | A1 | 12/2008 | Girdhar et al. | |

(Continued)

FOREIGN PATENT DOCUMENTS

| | | |
|---|---|---|
| KR | 20100019427 A | 2/2010 |
| KR | 20190038717 A | 4/2019 |

(Continued)

*Primary Examiner* — Steven B Gauthier
*Assistant Examiner* — Khatib A Rahman
(74) *Attorney, Agent, or Firm* — Slater Matsil, LLP

(57) ABSTRACT

Embodiments include a Schottky barrier diode (SBD) structure and method of forming the same, the SBD structure including a current blockage feature to inhibit current from leaking at an interface with a shallow trench isolation regions surrounding an anode region of the SBD structure.

20 Claims, 31 Drawing Sheets

(56) References Cited

U.S. PATENT DOCUMENTS

2019/0103498 A1 4/2019 Pang et al.
2021/0202716 A1* 7/2021 Lin .................. H01L 21/31111
2021/0391437 A1* 12/2021 Ohse .................. H10D 30/668
2022/0231173 A1 7/2022 Wu et al.

FOREIGN PATENT DOCUMENTS

KR 20210086460 A 7/2021
KR 20220103643 A 7/2022

* cited by examiner 158p
138
158p/n
138b
172A
170
140
128-1
138s
172C
148
118
F23
128-2

158p
138
172A
170
140
128-1
172C
148
118
F23
128-2

158p
138
172A
158n
138b
128-1
138s
172C
148
118
F23
128-2

158p
138
158p/158n
172A
138b
170
128-1
138s
172C
148
118
F23
128-2

SCHOTTKY BARRIER DIODE (SBD) LEAKAGE CURRENT BLOCKING STRUCTURE

PRIORITY CLAIM AND CROSS-REFERENCE

This application claims the benefit of U.S. Provisional Application No. 63/385,469, filed on Nov. 30, 2022, entitled "Structure of Combining Additional RPO Stacking and Edge High Dosage Implantation for Improving Schottky Barrier Diode (SBD) Performance," which application is hereby incorporated herein by reference.

BACKGROUND

Schottky barrier diodes (SBDs), or simply Schottky diodes, are commonly used in modern semiconductor devices. The Schottky diode enjoys many advantages, such as a low forward voltage drop and a high switching speed, and thus plays an important role in radio frequency circuits, power devices, and other semiconductor devices. Further, an integrated semiconductor device may be fabricated by incorporating Schottky diodes along with other semiconductor circuits.

While research has been conducted in hopes of improving the techniques of manufacturing the Schottky diodes, such techniques still fail to meet requirements in many aspects. Therefore, there is a need to further improve the structures and manufacturing methods for existing Schottky diodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
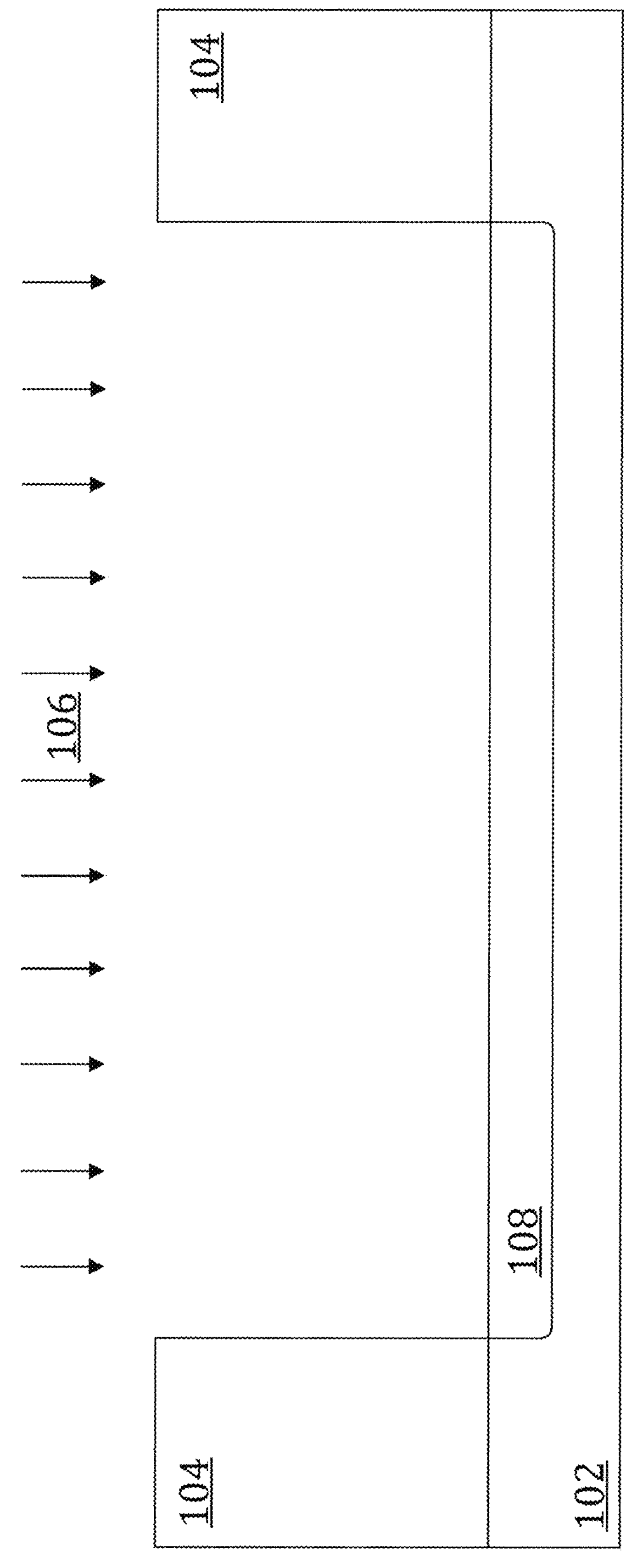
FIGS. 1 through 11 are various views of intermediate stages of a method of manufacturing an SBD, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

An SBD is formed at the junction of a semiconductor with a metal. A diode effect is achieved due to a difference in the work function between a semiconductor and a metal. When the SBD is forward biased, current is meant to flow freely from the anode to the cathode. When the SBD is reversed biased, current flow is ideally zero, however, in reality there will always be some leakage current in the reversed bias condition. Leakage current essentially results in unwanted power loss and excess heat generation. There are many causes for leakage current, for example, irregularities in the adjoining surfaces, crystal defects, insufficient barrier height, and physical boundary conditions.

Embodiments provide an SBD with lower leakage current by reducing leakage current at the physical boundaries (edge) of the metal electrode of the SBD and/or embodiments provide an SBD with an improved on current (Ion) condition. In some embodiments of the present disclosure, a resist protection structure (RPS) overlaps the semiconductor material and the edge shallow trench isolation (STI) structure, thereby reducing current leakage along the interface of the semiconductor material and edge STI structure. In some embodiments of the present disclosure, a high dosage p-type impurity is implanted in the edge semiconductor material (and partially in the boundary STI structure) to block the n well leakage pathway. In some embodiments of the present disclosure, a high dosage n type impurity is implanted in the edge semiconductor material (and partially in the boundary STI structure) to improve the Ion condition. In some embodiments, the RPS may be combined with the disclosed high dosage impurity edge implant. Some embodiments also optionally provide a polysilicon cap over part of the STI. In such embodiments, the RPS may also overlap the polysilicon cap and the high dosage p-type or n-type impurities may also be implanted in part of the polysilicon cap. The resulting SBD may be integrated into any applications requiring an SBD device.

Implanted impurities are discussed herein. Implanted impurities of the n-type conductivity may be selected from phosphorus, arsenic, antimony, bismuth, selenium, tellurium, and other suitable n-type dopants. Impurities of the p-type conductivity may be selected from boron, boron difluoride, or other suitable p-type dopants. For the sake of simplicity, the various doped wells and other doped structures discussed below are referred to by their nominal conductivity, such as a p-well, n-well, n-buried layer, and so forth. It should be understood that, unless otherwise noted, one of ordinary skill can reverse the conductivities to their opposite conductivity. This disclosure contemplates such alterations. For example, one of skill can substitute n-type dopants for p-type dopants and vice versa. Such a change may result in a change of a flow of electrons, e.g., free electrons versus holes, and a switch of cathode/anode, which are also contemplated. Thus, it should be understood that the conductivities discussed below can be reversed, however, for simplicity the discussion below is toward a particular conductivity arrangement. When reversing the conductivities, the disclosed concentrations of the impurities in the doped regions may remain the same or altered as necessary.

FIGS. 1 through 22 and 25 are various views of intermediate stages of a method of manufacturing the Schottky barrier diode (SBD) 100 (see FIG. 25), in accordance with some embodiments. FIGS. 23A, 23B, 23C, 23D, and 23E illustrate particular detailed views of various configurations of the SBD 100, and FIGS. 23A, 23B, and 23C include graphs of concentrations of impurities in different regions of the SBD 100. FIGS. 24A, 24B, 24C, 24D, 24E, and 26 are detailed and cross-sectional views of the SBD 100 according to various configurations of the SBD 100 where a cap is omitted from being disposed over a portion of an STI region. Of these Figures, FIGS. 1, 2, 3, 4, 5, 6, 8, 9, 11, 12, 13, 14, 15, 16, 17, 19, 20, 22, 23A, 23B, 23C, 23D, 23D, 24A, 24B, 24C, 24D, 24E, 25, and 26 are cross-sectional views (of which FIGS. 9, 17, 23A, 23B, 23C, 23D, 23D, 24A, 24B, 24C, 24D, 24E include enlarged portions of other Figures), and FIGS. 7, 10, 18, and 21 are top down views. It should be understood that additional operations can be provided before, during, and after processes shown in FIGS. 1 to 26, and some of the operations described below can be replaced or eliminated for additional embodiments of the method. The order of the operations and processes may be interchangeable. Further, the configuration, structure, materials, operations or processes employed in one embodiment may be identical to or similar to those employed in other embodiments, with like references referring to like structures, and the detailed explanation thereof may be omitted.

Referring to FIG. 1, a substrate 102 is formed or provided. The substrate 102 may be a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate layer that is typically formed of silicon or glass. Other substrates, such as a multi-layered or gradient substrate, may also be used. The substrate 102 may be doped (e.g., with a p-type or an n-type dopant) or undoped. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GainAs, GainP, and/or GainAsP; or combinations thereof.

Various devices may be formed on the substrate 102 in different regions of the substrate 102. The description herein describes a process of forming an SBD, however, it should be understood that various other devices may be formed at the same time in or on the substrate 102 using overlapping processes in other device regions or may be formed using separate processes.

A buried layer 108 is formed in the substrate 102. In some embodiments, the conductivity type of the buried layer 108 is n-type and hence the buried layer 108 is an n-buried layer (NBL). The buried layer 108 may be formed by forming a mask 104, and patterning the mask 104 to form an opening corresponding to the buried layer 108. In some embodiments, the mask 104 may be a photoresist mask formed and patterned using acceptable photolithography processes. Then an implantation operation **1*o*6 may implant impurities in the substrate 102 to a desired concentration. The mask 104 may then be removed by an ashing or etching process. The substrate 102 may be annealed to activate the impurities. In some embodiments, the dopant concentration of the buried layer 108** is between about 10E11 ions/cm3 and about 10E14 ions/cm3. The implanted impurities of the n-type conductivity may be any of those previously mentioned.

Figure 2:
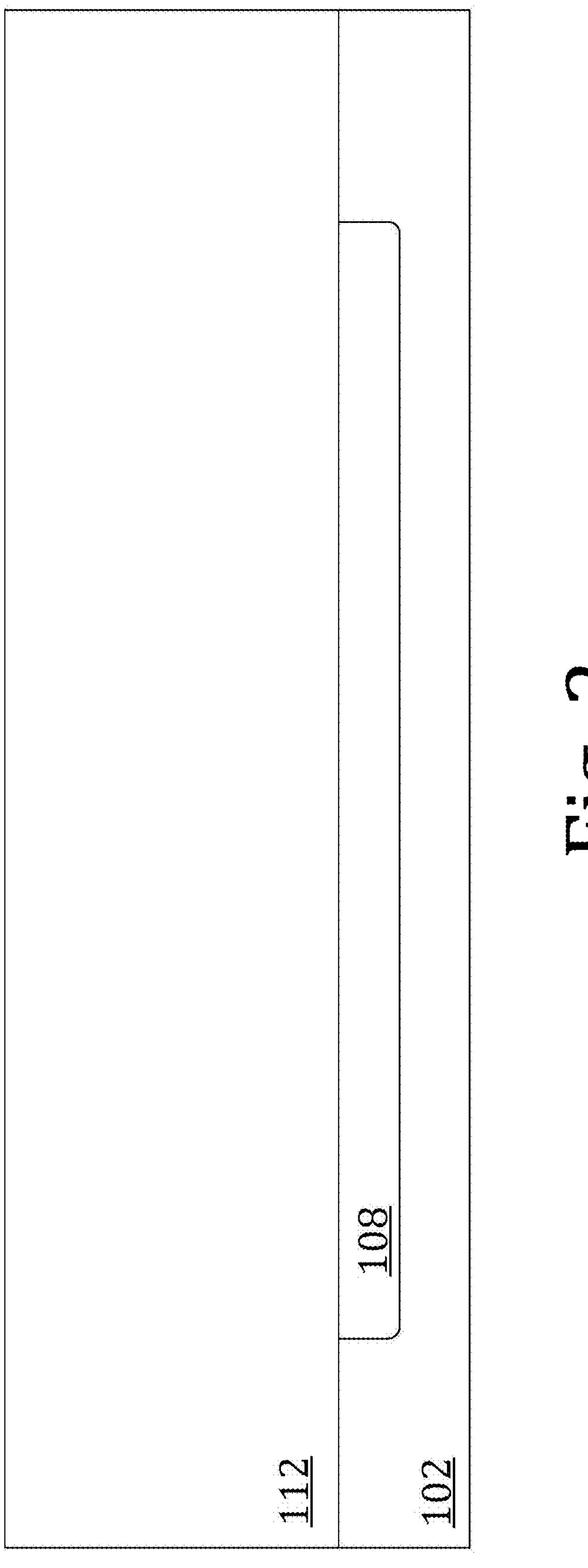

In FIG. 2, a second semiconductor layer 112 is formed over the substrate 102 and over the buried layer 108. In some embodiments, the second semiconductor layer 112 may be epitaxially grown over the substrate 102. The second semiconductor layer 112 may be doped or undoped and may be made of any of the candidate materials for the substrate 102, discussed above. In some embodiments, the second semiconductor layer 112 may be a different semiconductor material than the substrate 102 or may be the same semiconductor material as the substrate 102. When the second semiconductor layer 112 is doped, the dopant may have the same conductivity type as the substrate 102. In some embodiments, the dopant concentration of the second semiconductor layer 112 is between about 10E11 ions/cm3 and about 10E14 ions/cm3. In some embodiments, the second semiconductor layer 112 may be doped in situ during the epitaxial growth process by introducing impurities during the epitaxial growth process. In other embodiments, the semiconductor layer 112 may be doped by implanting impurities into the second semiconductor layer 112. Suitable impurities of the p-type conductivity may be any of those previously mentioned. In some embodiments, the implanted impurities may be doped outside a deep well 118 area (see FIG. 3) by masking (similar to the masking described below in conjunction with forming the deep well 118) the deep well 118 area and implanting impurities outside the deep well area 118.

Figure 3:
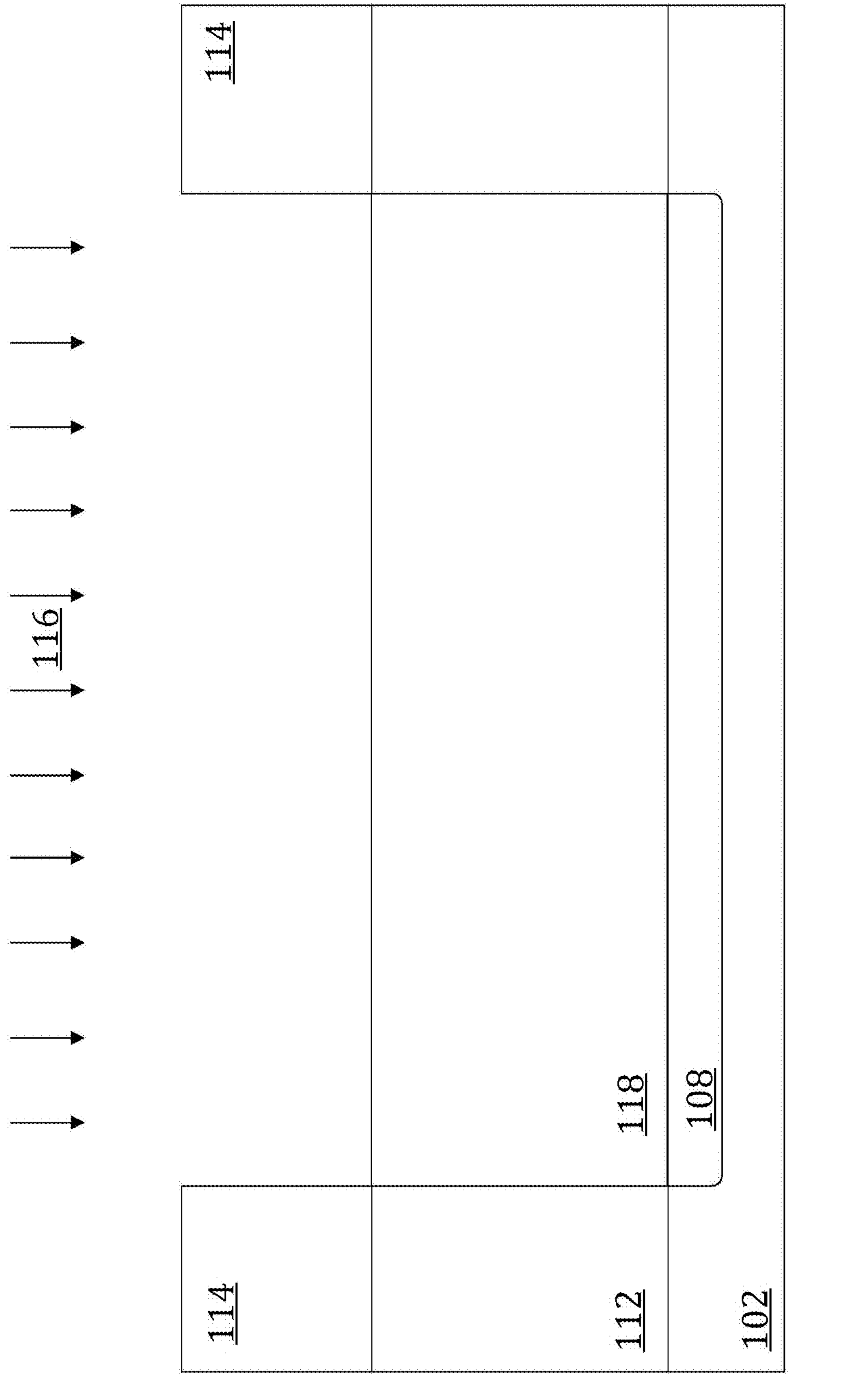

In FIG. 3, a deep well 118 is formed in the second semiconductor layer 112. The deep well 118 may be formed by a similar process as used to form the buried layer 108. In some embodiments, a mask 114 may be formed over the second semiconductor layer 112 and patterned to form an opening corresponding to the deep well 118. Then, an implantation operation 116 may implant impurities in the second semiconductor layer 118 to a desired concentration. In some embodiments, the concentration may be between about $10^{11}$ $cm^{-3}$ to about $10^{13}$ $cm^{-3}$. The impurities implanted may have the same type of conductivity as the buried layer 108. Due to the depth of the deep well 118, the deep well 118 may also be understood to be a high voltage well, suitable for use in a high voltage diode. In some embodiments, the mask 114 may be a photoresist mask formed and patterned using acceptable photolithography processes. Following the implantation operation 116, the mask 114 may then be removed by an ashing or etching process. The second semiconductor layer 112 may be annealed to activate the impurities, thereby forming the deep well 118 and the other impurities outside the deep well 118. In some embodiments, the deep well 118 may be doped with the impurities to concentration.

Figure 4:
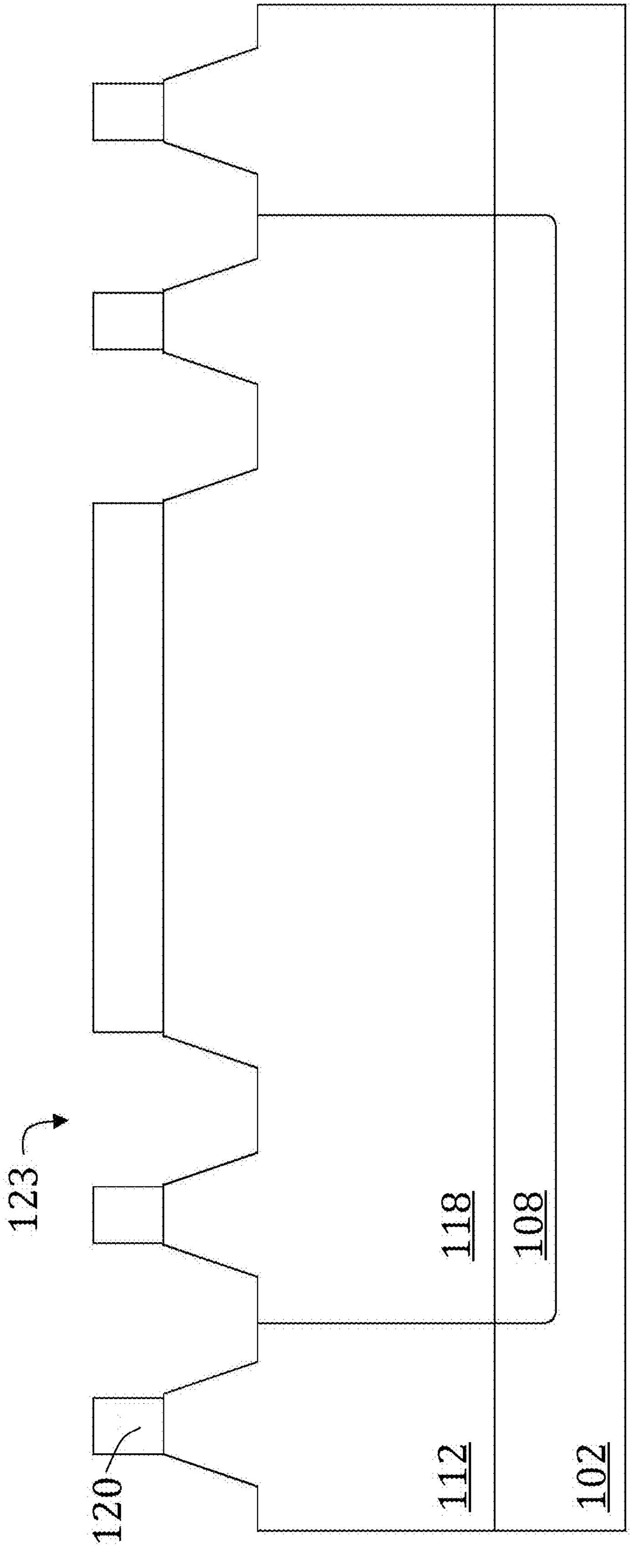
Figure 7:
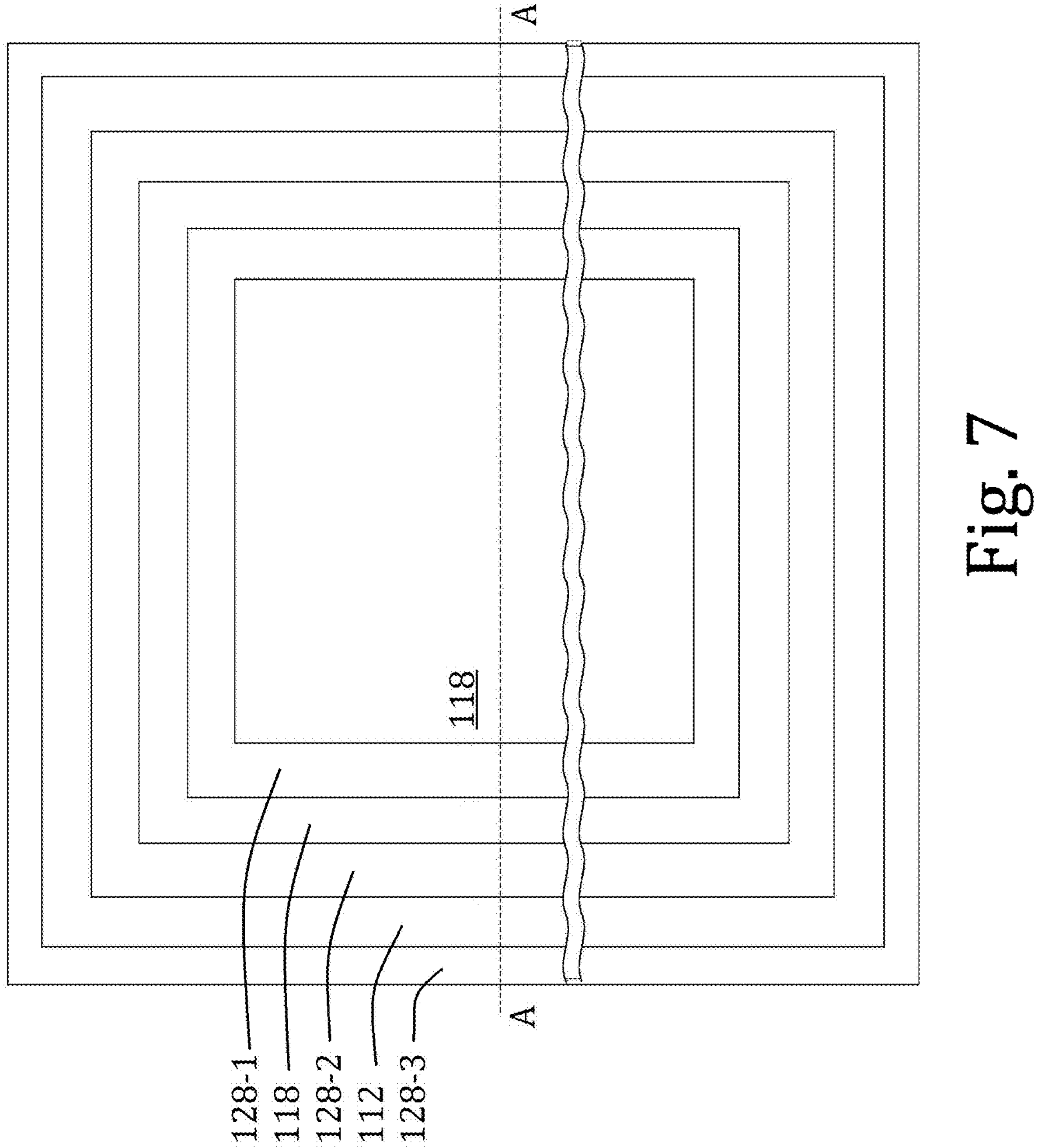

In FIG. 4, openings 123 for subsequently formed shallow trench isolation (STI) regions are formed. As indicated in FIG. 4, an opening 123 is formed at the edge boundaries of the deep well 118 where it meets the remaining second semiconductor layer 112. Openings 123 are also formed inset of the deep well 118 for separating one section of the deep well 118 from another section of the deep well 118. These separate sections will eventually become cathodes or anodes for the SBD device. Also illustrated in FIG. 4, openings 123 may be formed in the second semiconductor layer 112 to separate a section of the second semiconductor layer 112 from other portions of the second semiconductor layer 112. The openings 123 each make a loop around (i.e., circumnavigate an outer portion of) the deep well 118, inset the boundaries of the deep well 118, at the boundaries of the deep well 118, or outside the deep well 118. A top down view of the subsequently formed STI regions are illustrated in FIG. 7, described in more detail below. In some embodiments, the openings 123 may be formed by a photolithography etching process, including forming a mask 120 over the second semiconductor layer 112 and over the deep well 118, patterning the mask 120 to form openings corresponding to the openings 123, and etching the second semiconductor layer 112 and deep well 118 through the openings in the mask 120 to transfer the openings in the mask 120 to the second semiconductor layer 112 and deep well 118 to form the openings 123. The etching may be a wet etch or dry etch. In some embodiments, the etching may result in openings 123 which have angled sidewalls and a flat bottom. In other embodiments, the openings 123 may have rounded sidewalls or vertical sidewalls, and rounded bottom surface. Following the process of etching the openings 123, the mask 120 may then be removed by an ashing or etching process.

Figure 5:
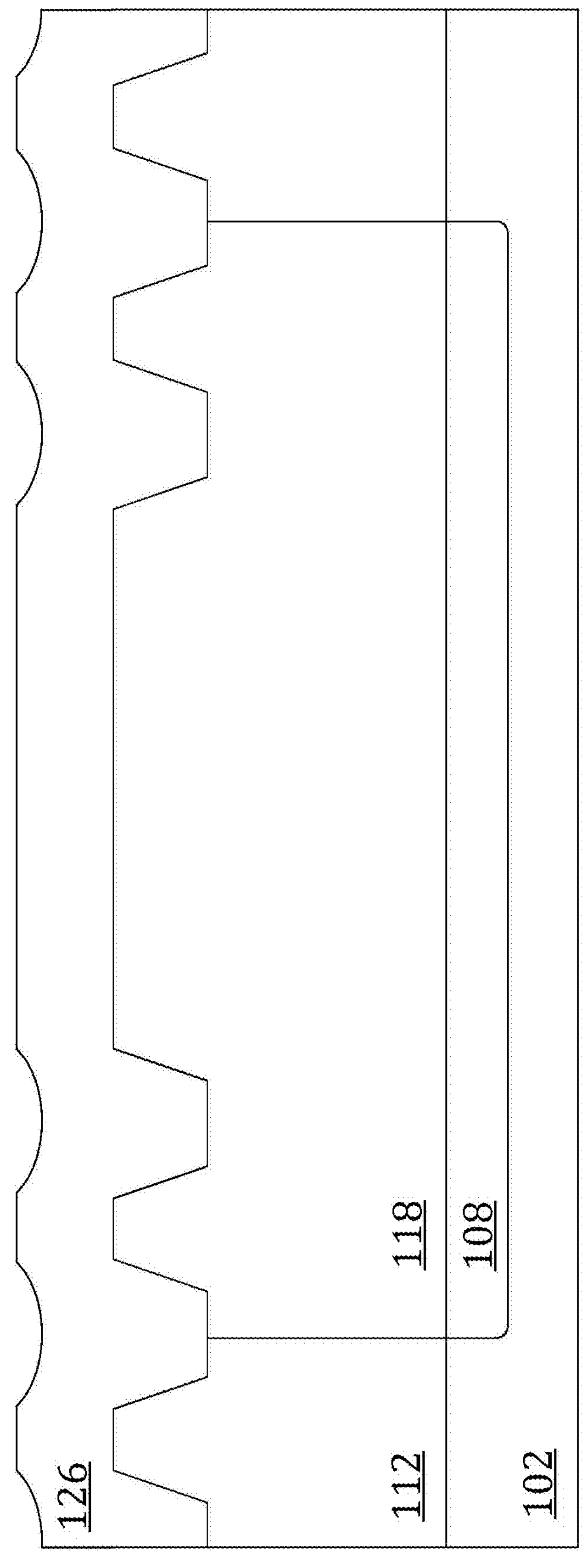

In FIG. 5, an insulating material 126 may be deposited in the openings 123 and over the upper surfaces of the second semiconductor layer 112. The insulating material may be any suitable material, such as silicon oxide, silicon nitride, silicon carbide, silicon oxynitride, silicon oxycarbonitride, the like, or combinations thereof. The deposition of the insulating material 126 may be by any suitable process, such as by spin coating, CVD (including flowable CVD, PECVD, etc.), PVD, and so forth, or combinations thereof.

Figure 6:
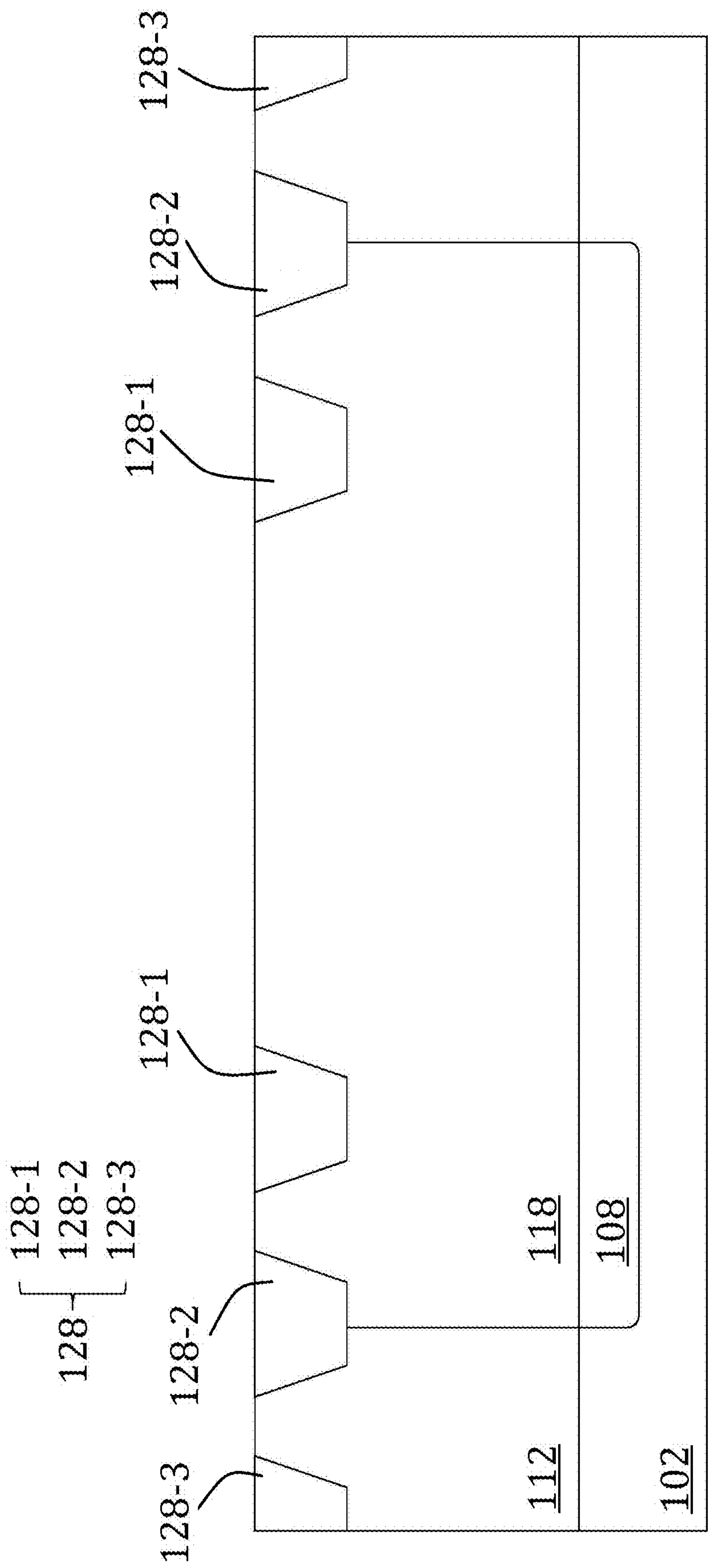

In FIG. 6, a leveling process or planarization process may be used to level upper surfaces of the second semiconductor layer 112 with upper surfaces of the insulating material 126, thereby separating the insulating material 126 into the STI regions 128. The STI regions 128 include first STI region 128-1, second STI region 128-2, and third STI region 128-3, which are further illustrated and discussed with respect to FIG. 7. In some embodiments, the leveling process may include a chemical mechanical polishing (CMP) process, a grinding process, an etch back process, or combinations thereof.

In FIG. 7, a top down view of the structure of FIG. 6 is provided, FIG. 6 being a cross-sectional view along the reference line A-A of FIG. 7. It should be understood that the view may merely be an excerpt of a larger workpiece. Further, the wavy lines extending horizontally signify that the structure may continue in one direction further than the other, even if it is generally depicted square in the given view. As depicted in FIG. 7, a center area (or depletion region) of the deep well 118 is surrounded by the first STI region 128-1. An outer area of the deep well 118 is disposed between the first STI region 128-1 and the second STI region 128-2, which surrounds the second STI region 128-2. Another portion of the second semiconductor layer 112 outside the deep well 118 is disposed between the second STI region 128-2 and the third STI region 128-3, which surrounds a portion of the second semiconductor layer 112.

Figure 8:
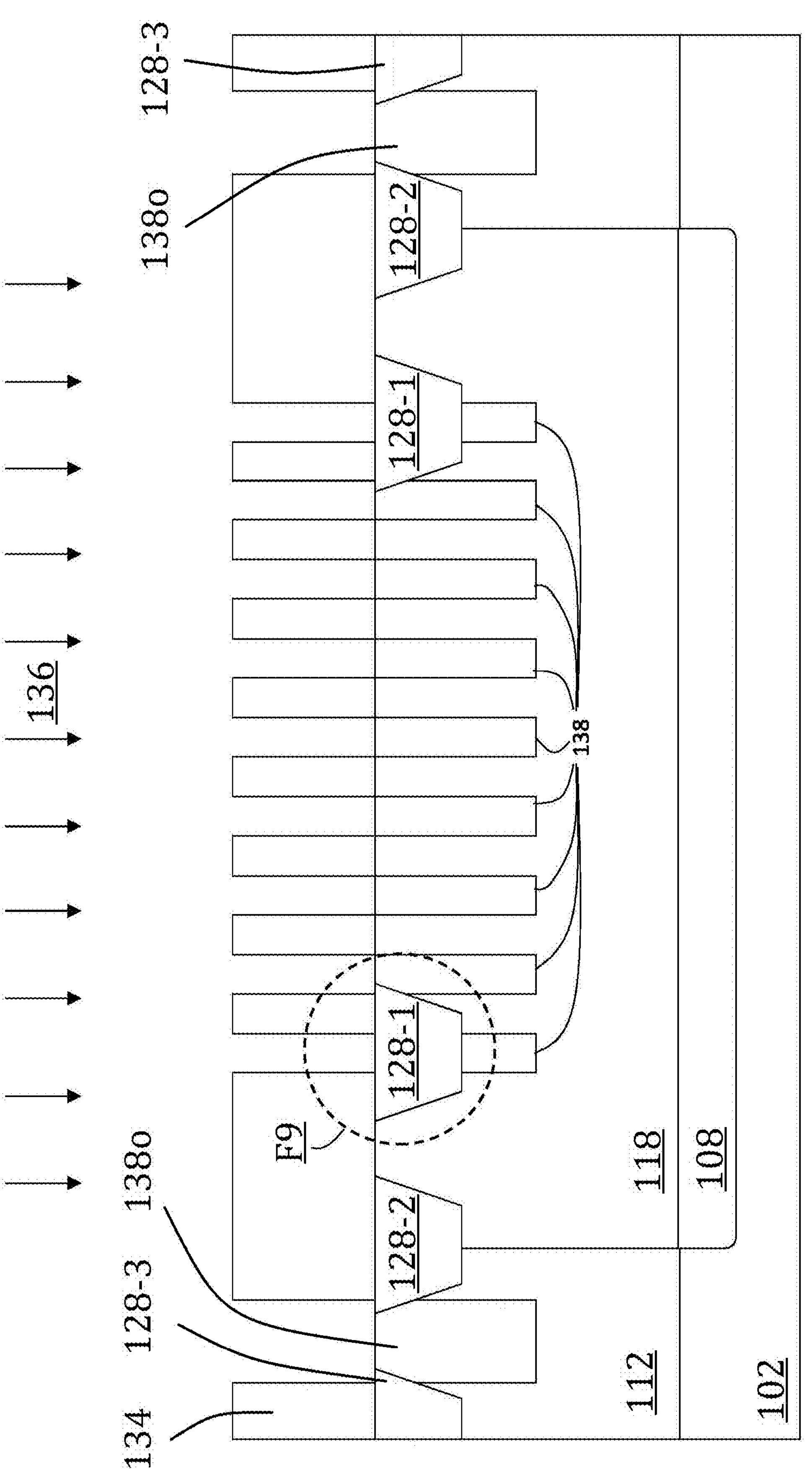

In FIG. 8, p-wells 138 are formed in the deep well 118 and in the second semiconductor layer 112. The p-wells 138 are arranged in parallel lines through the deep well 118. As indicated in FIG. 8, the p-wells 138 may also be formed through the first STI region 128-1 to extend below the first STI region 128-1 in the deep well 118. Further, the p-wells 138 may be formed immediately adjacent the first STI region 128-1. Indeed, in some embodiments, the p-wells 138 may contact the first STI region 128-1 in the deep well 118. Utilizing the p-wells 138 embedded in the deep well 118 is an arrangement known as a junction barrier Schottky (JBS) structure. By forming PN junctions between the p-wells 138 and the deep well 118, the depletion zone for the SBD is forced to remain physically nearer to the top of the JBS structure, providing faster response time for forward or reverse biasing. The p-wells 1380 formed in the second semiconductor layer 112 (between the third STI region 128-3 and the second STI region 128-2) are optional and may be used for biasing the second semiconductor layer 112 and substrate 102, for example with a connection to a reference voltage, such as ground.

The p-wells 138 (p-wells 138 refers to all p-wells 138*x*, unless otherwise noted, where x is another letter) may be formed by an implantation process 136 which implants impurities in the deep well 118 of opposite conductivity. In some embodiments, a mask 134 may be formed over the second semiconductor layer 112 and the deep well 118 and patterned to form openings corresponding to the p-wells 138. Then, an implantation operation 136 may implant impurities in the exposed portions of the deep well 118 to a desired concentration. The impurities implanted have an opposite conductivity from the deep well 118. In some embodiments, the mask 134 may be a photoresist mask formed and patterned using acceptable photolithography processes. Following the implantation operation 136, the mask 134 may then be removed by an ashing or etching process. The implanted regions may be annealed to activate the impurities, thereby forming the p-wells 138.

Figure 9:
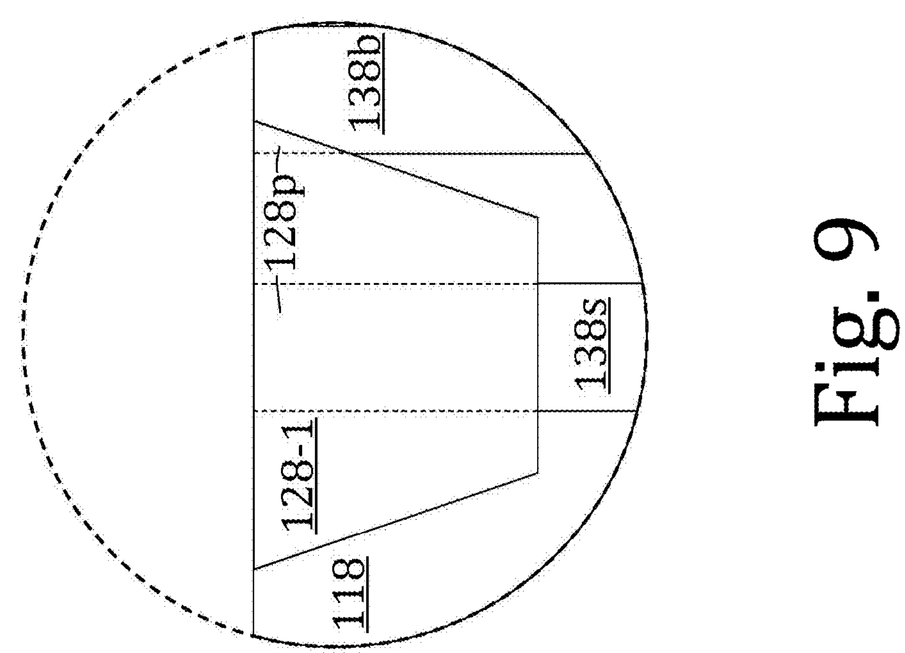

FIG. 9 shows an enlarged view of the dashed circle $F_9$ of FIG. 8. As illustrated in FIG. 9, the p-wells 138 near the first STI region 128-1 may be formed through the first STI region 128-1. Because the first STI region 128-1 is not a semiconductor material, the implanted impurities have negligible effect on the material of the first STI region 128-1, but may be useful in subsequent processes as noted below for implanting additional higher concentration impurities of the same type as the p-wells 138 or wells of the opposite type as the p-wells 138 for blocking or enhancement purposes. The areas 128*p* of the first STI region 128-1 which are implanted with the impurities are show in dashed outline. Further, FIG. 9 illustrates that an interface may be formed between the first STI region 128-1 and a first one of the p-wells 138 at the inner edge of the first STI region 128-1. The p-wells 138 which touch the edge of the first STI region 128-1 on each side are referred to as boundary p wells 138*b*. The p-wells 138 which are disposed below the first STI region 128-1 are referred to as sub p-wells 138*s*. The boundary p-wells 138*b* and the sub p-wells 138*s* may be omitted in some embodiments. FIG. 9 also illustrates that an interface may be formed between the first STI region 128-1 and the p-wells 138*s* below the first STI region 128-1 so that the p-wells 138*s* extends continuously from beneath the first STI region 128-1.

Figure 10:
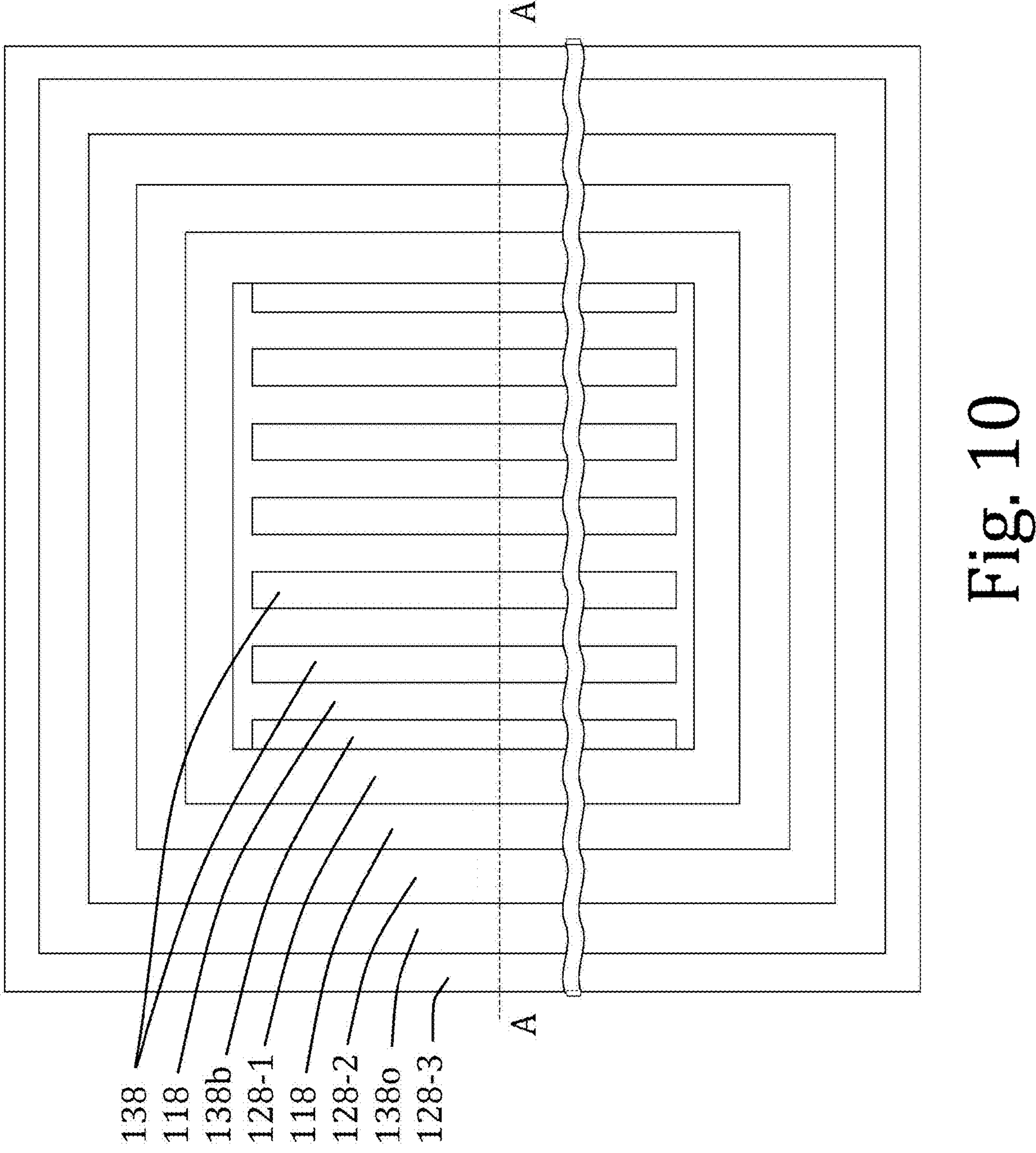

In FIG. 10, a top down view of the structure of FIG. 8 is provided, FIG. 8 being a cross-sectional view along the reference line A-A of FIG. 10. The view of FIG. 10 is similar to that of FIG. 7, except the p-wells 138 have been formed. As illustrated in FIG. 10, two of the p-wells 138 has an interface with the first STI region 128-1 along the outer edges of the each of the two p-wells 138 in the inner part of the deep well 118.

Figure 11:
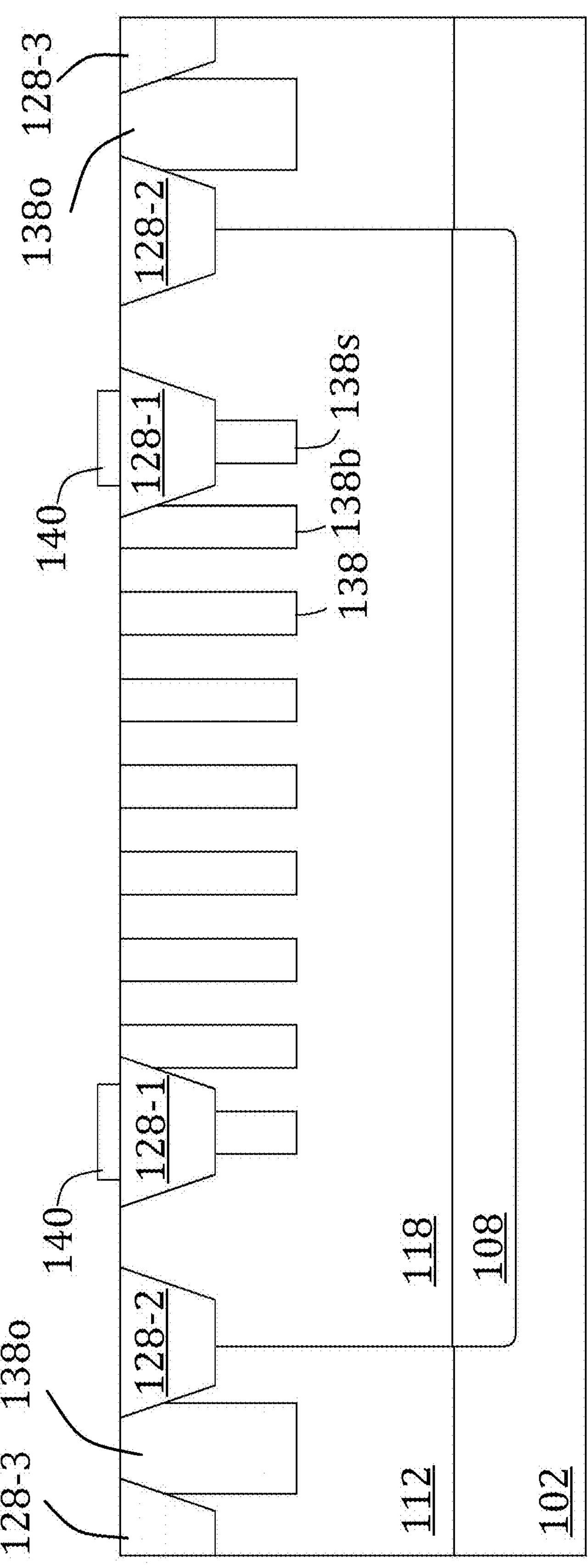

In FIG. 11, an optional cap 140 may be formed over the first STI region 128-1. For the sake of simplicity, the optional cap 140 will be shown in the remaining Figures, except for FIGS. 24A, 24B, 24C, 24D, 24E, and 26, as explained below. In some embodiments, the cap 140 may be formed of a conductive, semi-conductive, or non-conductive material. For example, the cap 140 may be formed of a metallic material or a polysilicon material. If formed of a metallic material, the cap 140 may be formed by depositing a seed layer (not shown) over the surface of the workpiece, forming a patterned mask (such as a photoresist mask) over the seed layer (the patterned mask exposing a portion of the seed layer), plating the cap 140 on the exposed portion of the seed layer, removing the patterned mask, and etching the un-plated portions of the seed layer that remain. If formed of a polysilicon material, the cap 140 may be formed by forming a patterned mask may over the workpiece, forming a polysilicon material within the opening, and removing the patterned mask. If formed of an insulating material, cap 140 may be formed by blanket depositing the insulating material over the workpiece, forming a mask over the portions of the insulating material to keep, and removing the rest of the insulating material by an etching process. Then the mask may be removed and the remaining portion is the cap 140. When forming a cap 140 from a metallic material or from polysilicon, in each of these options, a planarization process, such as a CMP process, may be used to level upper surfaces of the deposited material of the cap 140 prior to removing the patterned mask. When forming the cap 140 from polysilicon, prior to removing the patterned mask, an implantation process (not shown) may be used to implant dopants into the polysilicon material, thereby altering the resistivity of the polysilicon to form a polysilicon resistor as the cap 140. When the cap 140 is formed of a conductive or semi-conductive material, it can function to help disperse the electric field. More details regarding the cap 140 are discussed below with respect to the enlarged view of FIG. 17.

Figure 12:
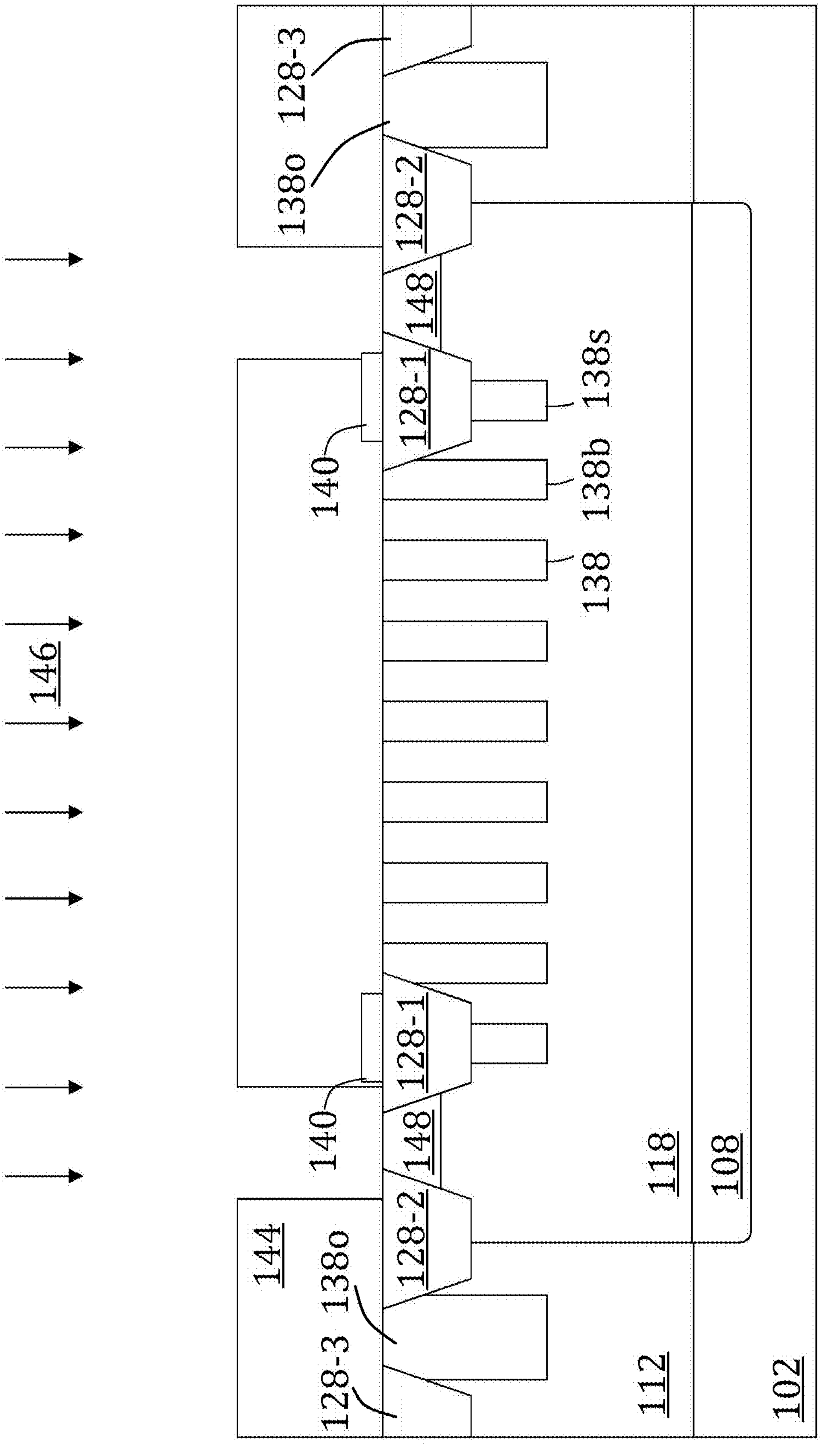
FIGS. 12-13 are cross-sectional views of intermediate stages of an optional edge well doping process, in accordance with some embodiments.
Figure 13:
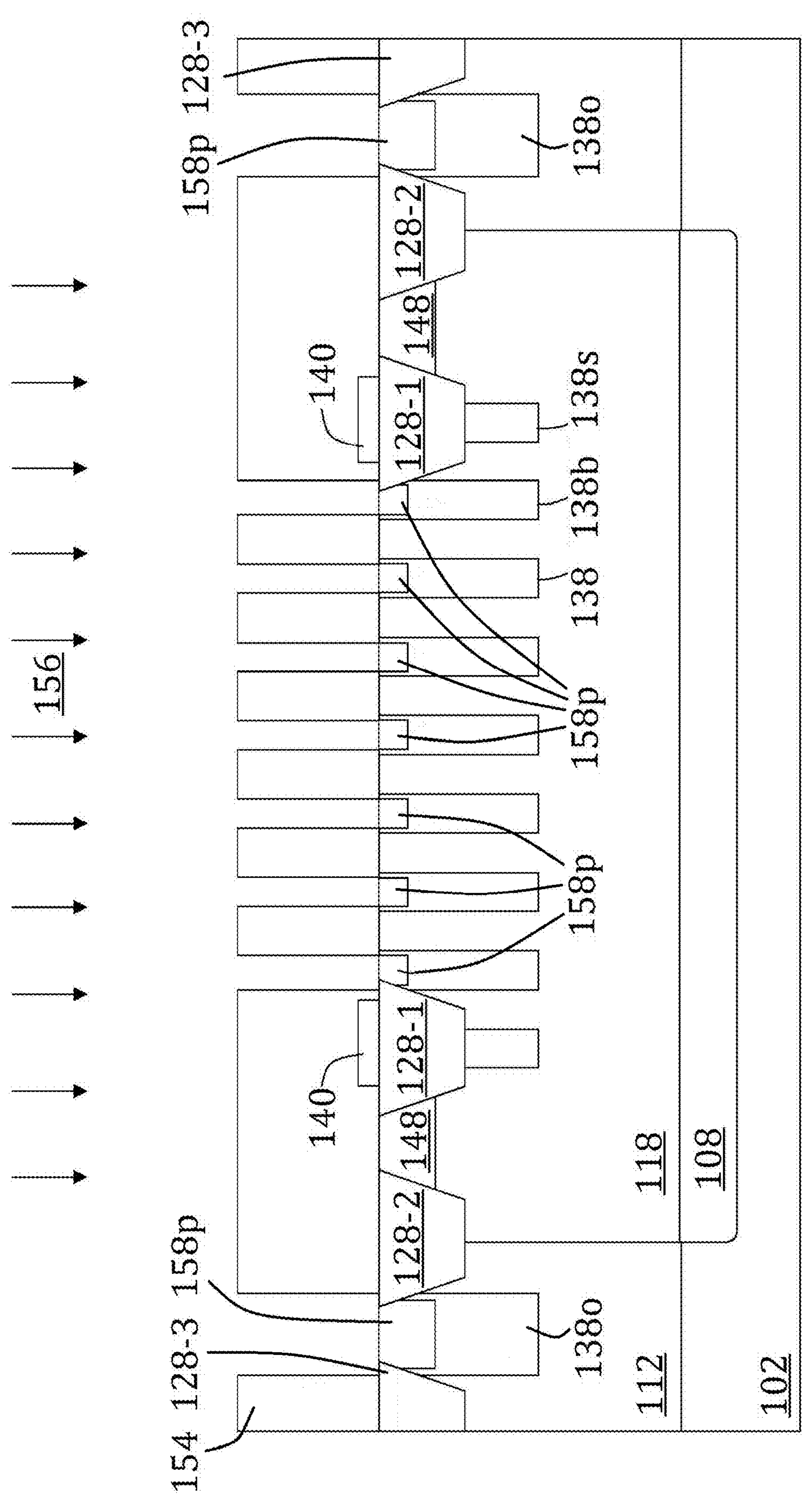

In FIGS. 12 and 13, n+ wells 148 and p+ wells 158*p* are formed in the deep well 118 and in the p-wells 138 respectively. In this disclosure, n+ and p+ indicate a higher concentration of n-type dopants and p-type dopants, respectively, than the concentration of dopants immediately surrounding the n+ wells 148, in the deep well 118, and the p+ wells 158*p*, in the p-wells 128.

In FIG. 12, n+ wells 148 are formed in the deep well 118 between the second STI region 128-2 and the first STI region 128-1. The n+ wells 148 are formed by an implantation process which implants impurities of the same type as the deep well 118, thereby creating a higher concentration of n-type impurities at an upper surface of the deep well 118 between the first STI region 128-1 and the second STI region 128-2. In FIG. 12, the n+ wells 148 extend from the first STI region 128-1 to the second STI region 128-2, however, in some embodiments, some of the deep well 118 may be interposed between the n+ well 148 and the first STI region 128-1 and/or the second STI region 128-2. In other words, in some embodiments, the n+ wells 148 are narrower than the distance between the first STI region 128-1 and the second STI region 128-2. As illustrated in FIG. 12, however, in other embodiments, the n+ wells 128 may also be partially implanted in the first STI region 128-1 and the second STI region 128-2 so that they extend between the first STI region 128-1 and second STI region 128-2 for some or all of the depth of the n+ wells 148.

The n+ wells 148 may be formed by an implantation process 146 which implants impurities in the deep well 118 of the same conductivity to a concentration about 100 to 1000 times greater than the concentration of impurities in the deep well 118. In some embodiments, the concentration may be between about $10^{14}$ $cm^{-3}$ to about $10^{16}$ $cm^{-3}$. In some embodiments, a mask 144 may be formed over the second semiconductor layer 112 and the deep well 118 and patterned to form openings corresponding to the n+ wells 148. Then, an implantation process 146 may implant impurities in the exposed portions of the deep well 118 to a desired concentration. The impurities implanted have the same conductivity as the deep well 118. In some embodiments, the mask 144 may be a photoresist mask formed and patterned using acceptable photolithography processes. Following the implantation process 146, the mask 144 may then be removed by an ashing or etching process. The implanted regions may be annealed to activate the impurities, thereby forming the n+ wells 148.

In FIG. 13, p+ wells 158*p* are formed in the upper portions of the p-wells 138. The p+ wells 158*p* are formed by an implantation process which implants impurities of the same type as the p-wells 138, thereby creating a higher concentration of p-type impurities at an upper surface of the p-wells 138. In FIG. 13, the p+ wells 158*p* do not extend completely across the p-wells 138. Instead a shoulder of the p-wells 138 surrounds the p+ wells 158*p* on each side. In some embodiments, however, the p+ wells 158*p* may extend completely across the p-wells 138. Also, the p+ well 158*p* may be partially implanted in the first STI region 128-1 at the boundary between the first STI region 128-1 and the p-well 138 so that the resulting p+ well has an interface with the first STI region 128-1. Regions of p+ wells 158*p* may also be formed in the optional p-wells 138 which are in the second semiconductor layer outside the deep well 118, between the second STI region 128-2 and the third STI region 128-3.

The p+ wells 158*p* may be formed by an implantation process 156 which implants impurities in the p-wells 138 of the same conductivity to a concentration about 100 to 1000 times greater than the concentration of impurities in the p-well 138. In some embodiments, the concentration may be between about $10^{14}$ $cm^{-3}$ to about $10^{16}$ $cm^{-3}$. In some embodiments, a mask 154 may be formed over the second semiconductor layer 112 and the deep well 118 and patterned to form openings corresponding to the p+ wells 158*p*. Then, an implantation process 156 may implant impurities in the exposed portions of the p+ wells 158*p* to a desired concentration. The impurities implanted have the same conductivity as the p-wells 138. In some embodiments, the mask 154 may be a photoresist mask formed and patterned using acceptable photolithography processes. Following the implantation process 156, the mask 154 may then be removed by an ashing or etching process. The implanted regions may be annealed to activate the impurities, thereby forming the p+ wells 158*p*.

Figure 14:
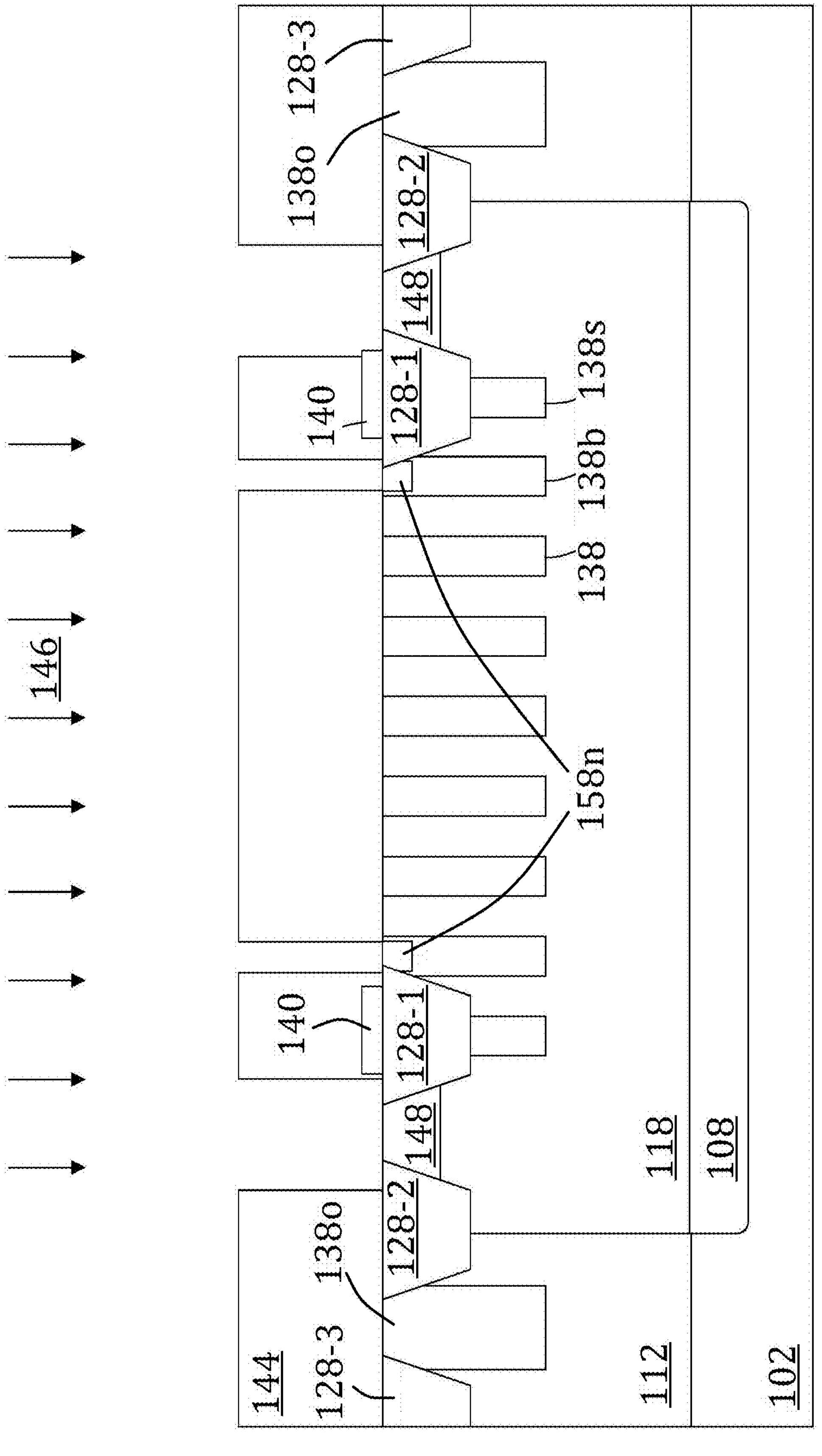
FIGS. 14-15 are cross-sectional views of intermediate stages of an alternative optional edge well doping process, in accordance with some embodiments.
Figure 15:
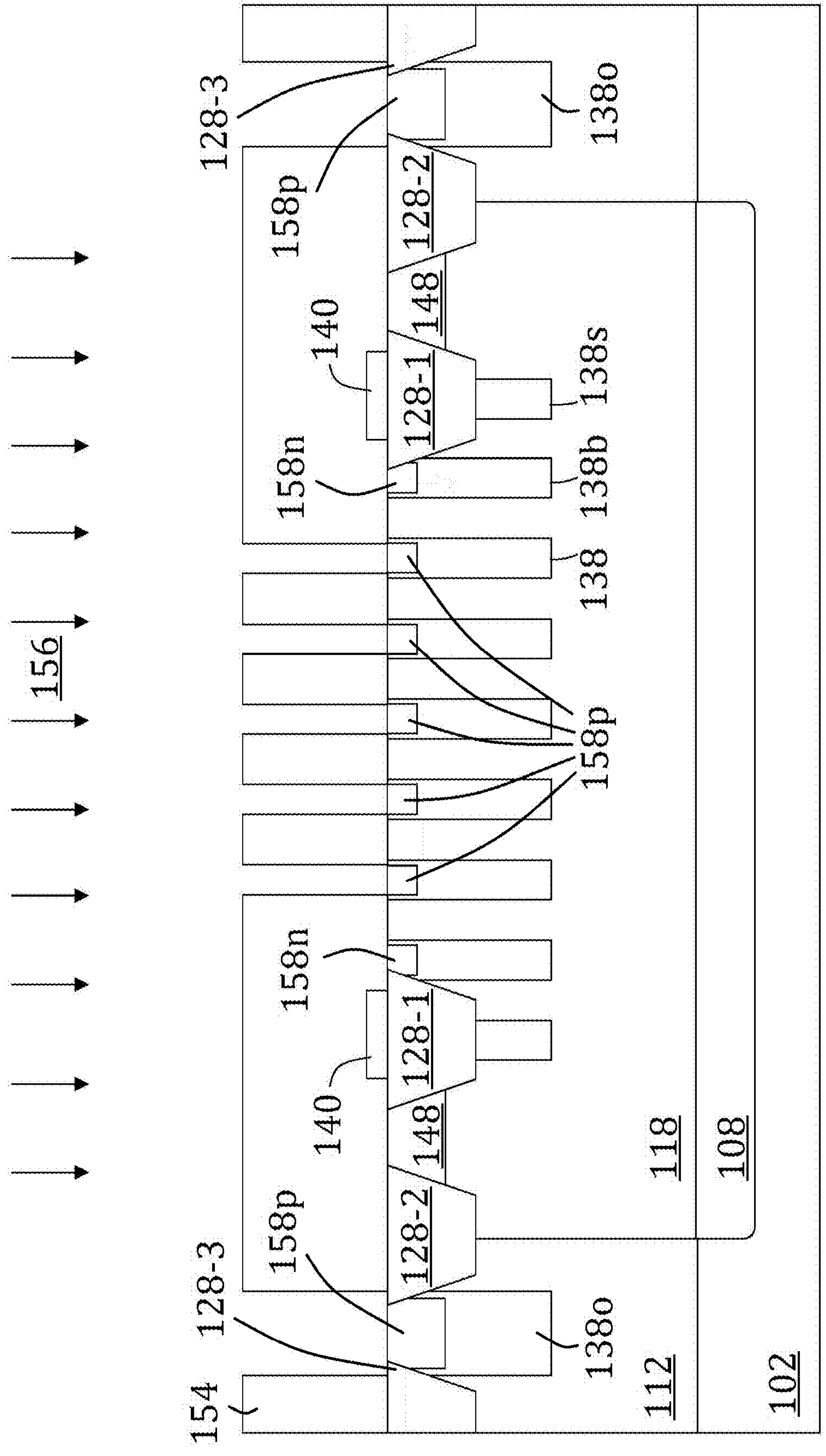

In FIGS. 14 and 15, alternative, but similar structures may be formed using the processes and materials described above with respect to FIGS. 12 and 13, in accordance with some embodiments. In FIG. 14, instead of forming a p+ well 158*p* at the boundary p-well 138*b*, an n+ well 158*n* is formed within the boundary p-well 138*b*. In some embodiments, the n+ well 158*n* may be formed in the same implantation process 146. As such, it can be formed to the same species and concentrations as the n+ wells 148. In such embodiments, the mask 144 may be patterned to expose a portion of the boundary p-well 138*b*. Then the implantation process 146 will implant n-type impurities in the exposed areas, including the boundary p-well 138*b*. In other embodiments, the boundary p-well 138*b* may be separately implanted to form the n+ wells 158*n* utilizing another mask and implantation process. In such embodiments, the concentration of n-type impurities in the n+ wells 158*n* may be customized for the separate implantation process and, as a result, the concentration and species of impurities in the n+ wells 158*n* may be different than those in the n+ wells 148, the concentrations still being about 100 to about 1000 times higher than the deep well 118, such as between about 104 $cm^{-3}$ to about $10^{16}$ $cm^{-3}$. The remaining process and materials are the same as those described with respect to FIG. 12 and are not repeated.

In FIG. 15, because the n+ well 158*n* is formed, the mask 154 of FIG. 15 does not expose the boundary p-well 138*b*. As a result, a p+ well 158 is not formed in the boundary p-wells 138*b*. The remaining process and materials are the same as those described with respect to FIG. 13 and are not repeated.

Figure 16:
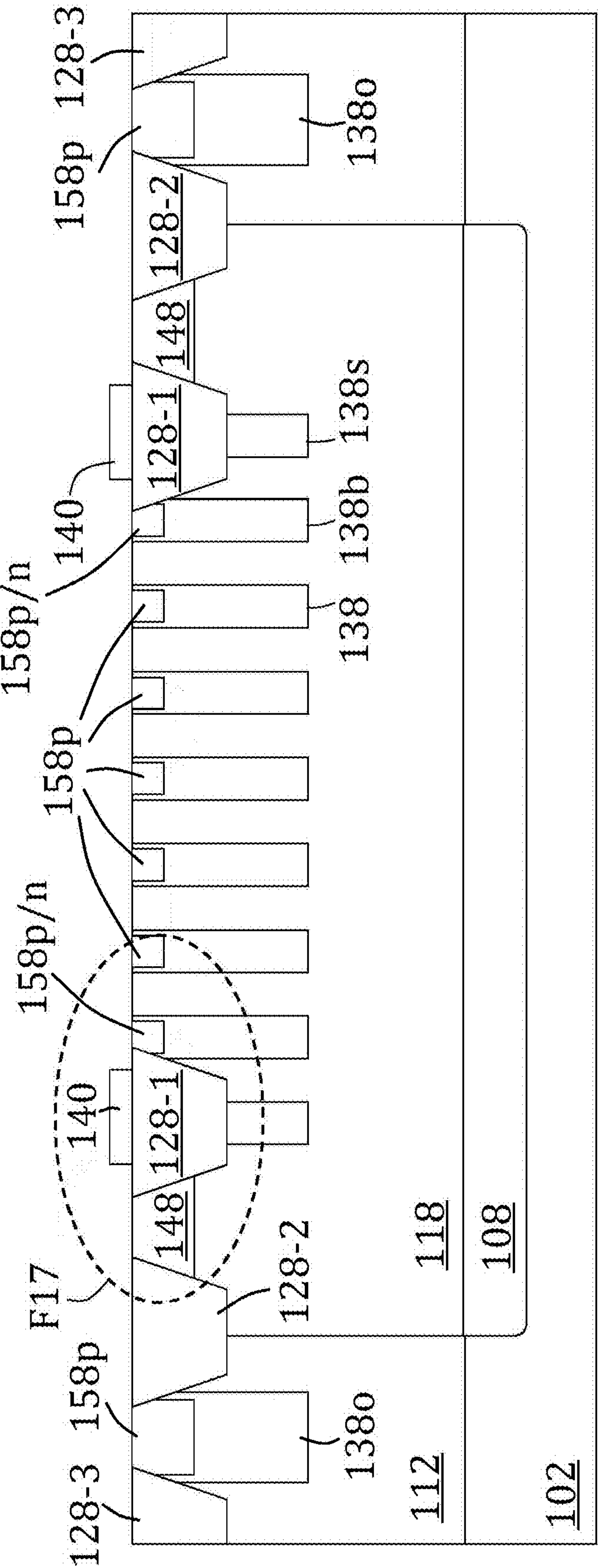
FIGS. 16-22 are various views of continuing intermediate stages of a method of manufacturing an SBD, in accordance with some embodiments.

FIG. 16 presents a combined view of FIGS. 13 and 15 which is provided for the sake of brevity. In FIG. 16, the boundary p-wells 138*b* may have a p+ well 158*p* formed therein or (but not both) an n+ well 158*n* formed therein, as noted above with respect to FIGS. 12 and 14, respectively. To simplify the further discussion, unless otherwise provided below, the combined view includes a reference to edge+ wells 158*p/n* to signify that either one of the p-wells 158*p* or n-wells 158*n* may be used in the boundary p-wells 138*b*.

Figure 17:
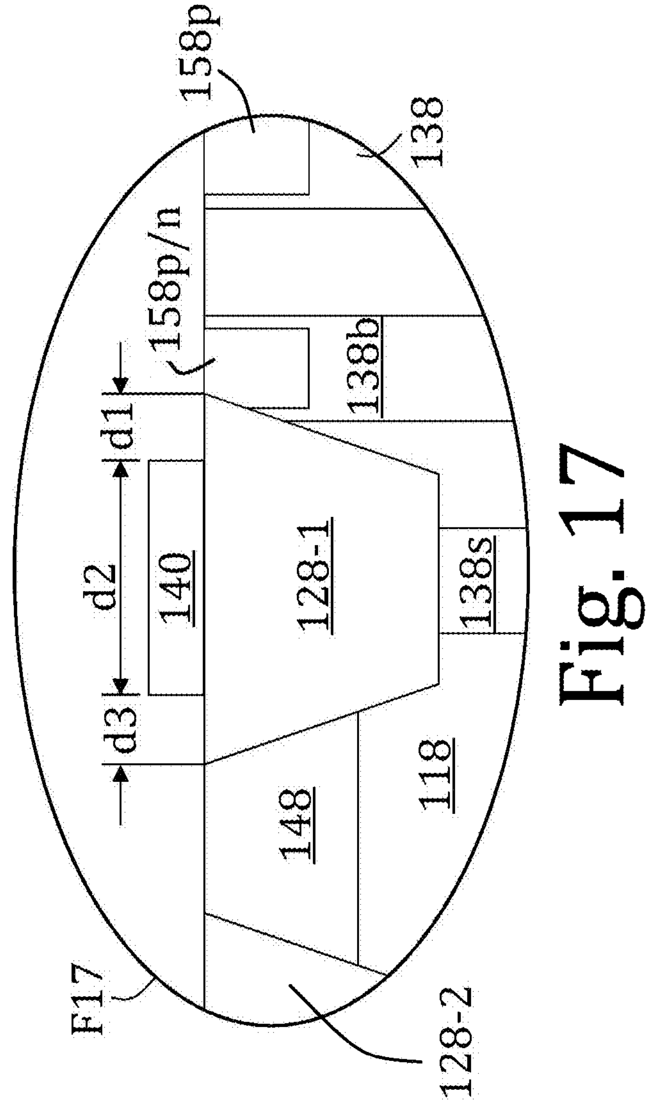

FIG. 17 is an enlarged view of the dashed oval F17 of FIG. 16. The view of FIG. 17 shows the n+ wells 148 disposed in the deep well 118 between the first STI region 128-1 and the second STI region 128-2 and the p+ wells 158*p* in the inner p-wells 138. The view of FIG. 17 also illustrates the edge+ wells 158*p/n* as a combined view of either the p+ wells 158*p* or the n+ wells 158*n* at the upper surface of the boundary p-well 138*b*. Notably, the edge+ wells 158*p/n* have an interface with the first STI region 128-1 so that at the interface of the first STI region 128-1 and the edge+ wells 158*p/n*, a portion of the sidewall of the first STI region 128-1 is completely covered by the edge+ wells 158*p/n*. As explained below, when the edge+ wells 158*p/n* are p+ wells 158*p*, the p+ wells 158*p* block leakage current thereby improving Ioff performance, and when the edge+ wells 158*p/n* are n+ wells 158*n*, the n+ wells 158*n* improve Ion performance of the SBD 100. The p+ wells 158*p* will block current from leaking along the interface of the first STI region 128-1 and the p+ wells 158*p* from the subsequently formed anode. Similarly, the n+ wells 158*n* will block current from leaking along the interface of the first STI region 128-1 and the n+ wells 158*n* from the subsequently formed cathode. In some embodiments, the cap 140 may have a thickness between about 100 nm and 300 nm, though other values may be used. The cap may be disposed a distance d1 between about 100 nm and about 400 nm from an edge of the first STI region 128-1 nearest the edge+ wells 158*p/n*, may have a width d2 between about 1000 nm and 2000 nm, and may be disposed a distance d3 from the n+ well 148 between about 100 nm and 400 nm, although other dimensions may be used. The cap 140 may therefore be positioned equidistant from either side of the first STI region 128-1 or may be offset to one side or the other, depending on how wants the electrical filed to disperse. In some embodiments, a ratio of the width d3 to d1 may be between about 1:2 and 2:1.

Figure 18:
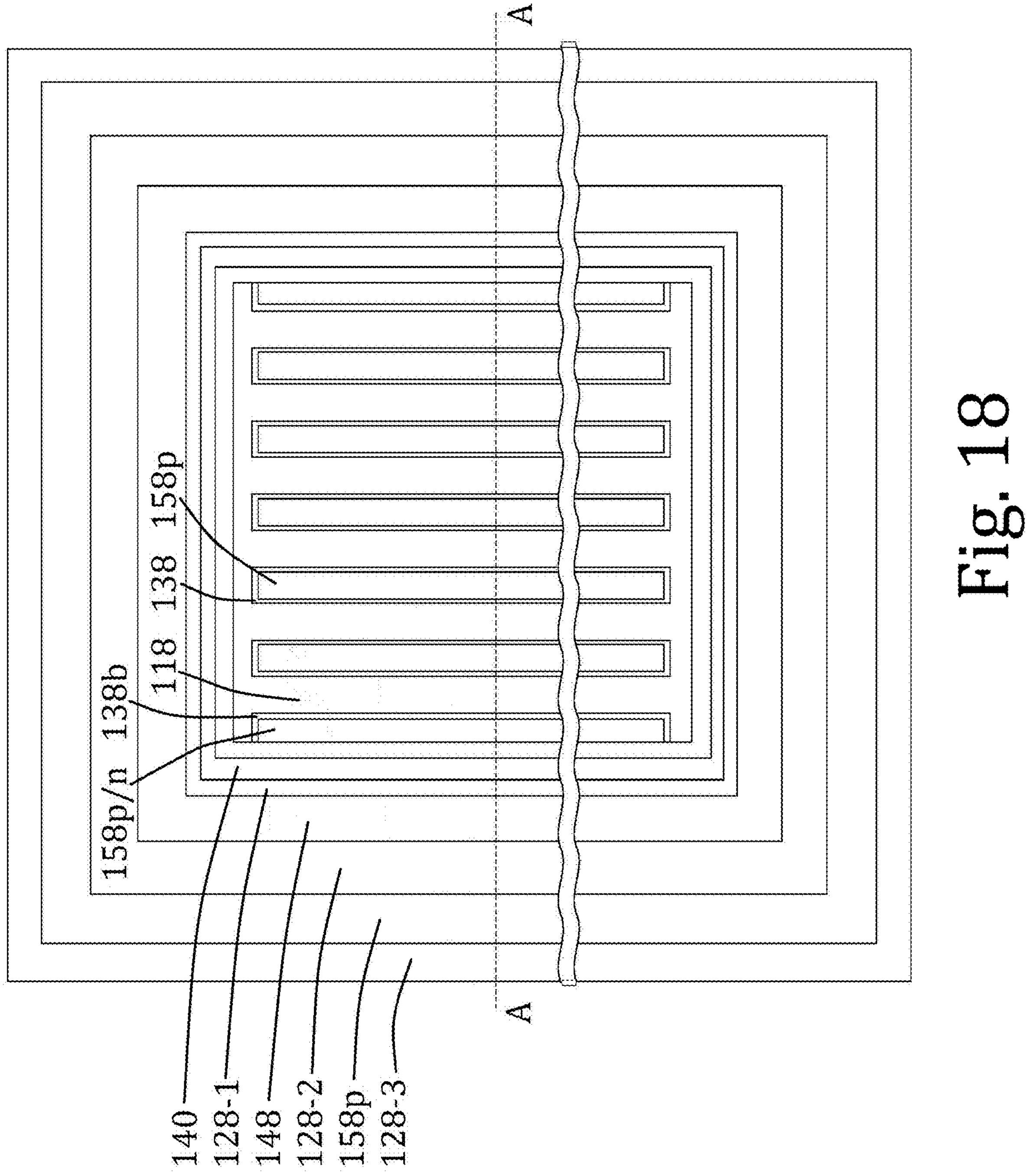

In FIG. 18, a top down view of the structure of FIG. 16 is provided, FIG. 16 being a cross-sectional view along the reference line A-A of FIG. 18. The view of FIG. 18 is similar to that of FIG. 10, except the p+ wells 158*p*, n+ wells 148, and edge+ 158*p/n* have been formed. As illustrated in FIG. 18, the edge+ wells 158*p/n* have an interface with the first STI region 128-1 along the outer edges of the each of the two edge+ wells 158*p/n* in the inner part of the deep well 118.

Figure 19:
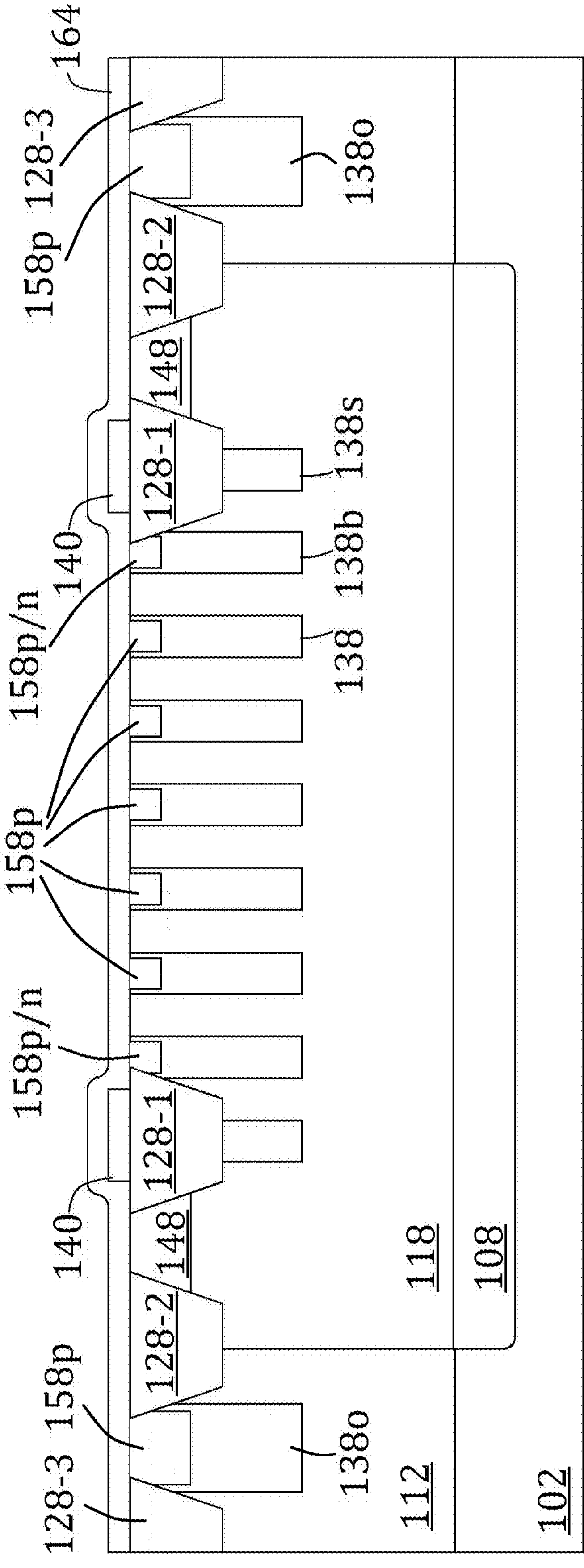

In FIG. 19, in some embodiments, a protection film 164 is formed over the workpiece, including the upper surfaces of the second semiconductor layer 112, the deep well 118, the STI regions 128, the p-wells 138, the n+ wells 148, the p+ wells 158*p*, the edge+ wells 158*p/n*, and the cap 140. The protection film 164 may be formed of any suitable insulating material, such as silicon oxide, silicon nitride, silicon carbide, silicon oxycarbide, silicon oxycarbonitride, and so forth, the like, or combinations thereof. The protection film 164 may be deposited using any suitable technique such as by CVD, PVD, spin coating, and so forth. The thickness of the protection film 164 may be between about 25% and 200% of the thickness of the cap 140, such as between about 50 nm and about 400 nm.

Figure 20:
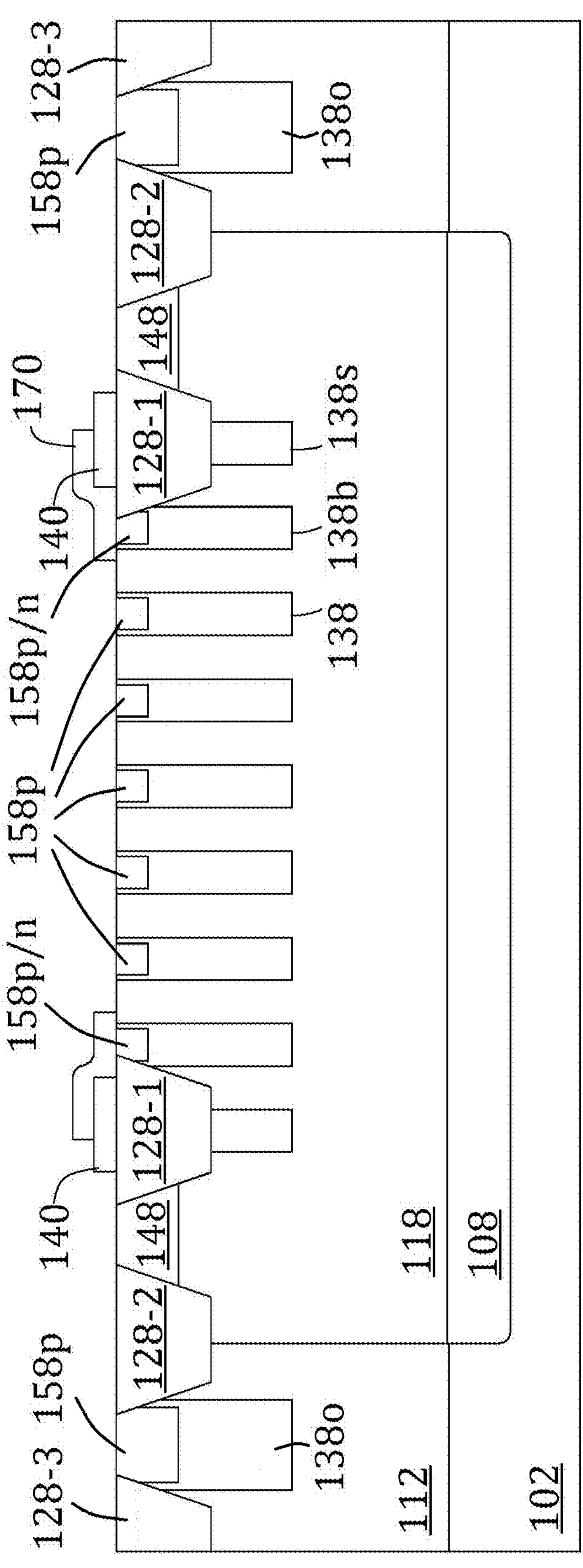

In FIG. 20, in embodiments utilizing the protection film 164, the protection film 164 is patterned to form protection structures 170. The protection structures 170 have a first portion disposed on an upper surface of the cap 140 (if used), a second portion formed over the deep well 118 (if used) (on the edge+ wells 158*p/n* (if used), the boundary p-wells 138*b*, and extending, in some embodiments, to the deep well 118), and a third portion interposed between the first portion and the second portion, covering part of the first STI region 128-1. In some embodiments, the second portion may extend partially over the boundary p-well 138*b* and not necessarily beyond the boundary p-well 138*b*. The protection structures 170 provide current pathway blockage to reduce or prevent leakage current to leak down the interface of the first STI region 128-1 at the sidewall interface between the first STI region 128-1 and the deep well 118 (in the case where the boundary p-wells 138*b* are omitted), the boundary p-wells 138*b*, or the edge+ wells 158*p/n*. The protection structures 170 also block a portion of the semiconductor material that makes up the second semiconductor layer 112 (from which the deep well 118, boundary p-wells 138*b*, or edge+ wells 158*p/n* are made), such that when a subsequent silicide is formed over the inner p-wells 138 and the deep well 118 (e.g., over the depletion region), the silicide will be inset a lateral distance (e.g., distance d6 of FIG. 23A) from the first STI region 128-1.

Figure 21:
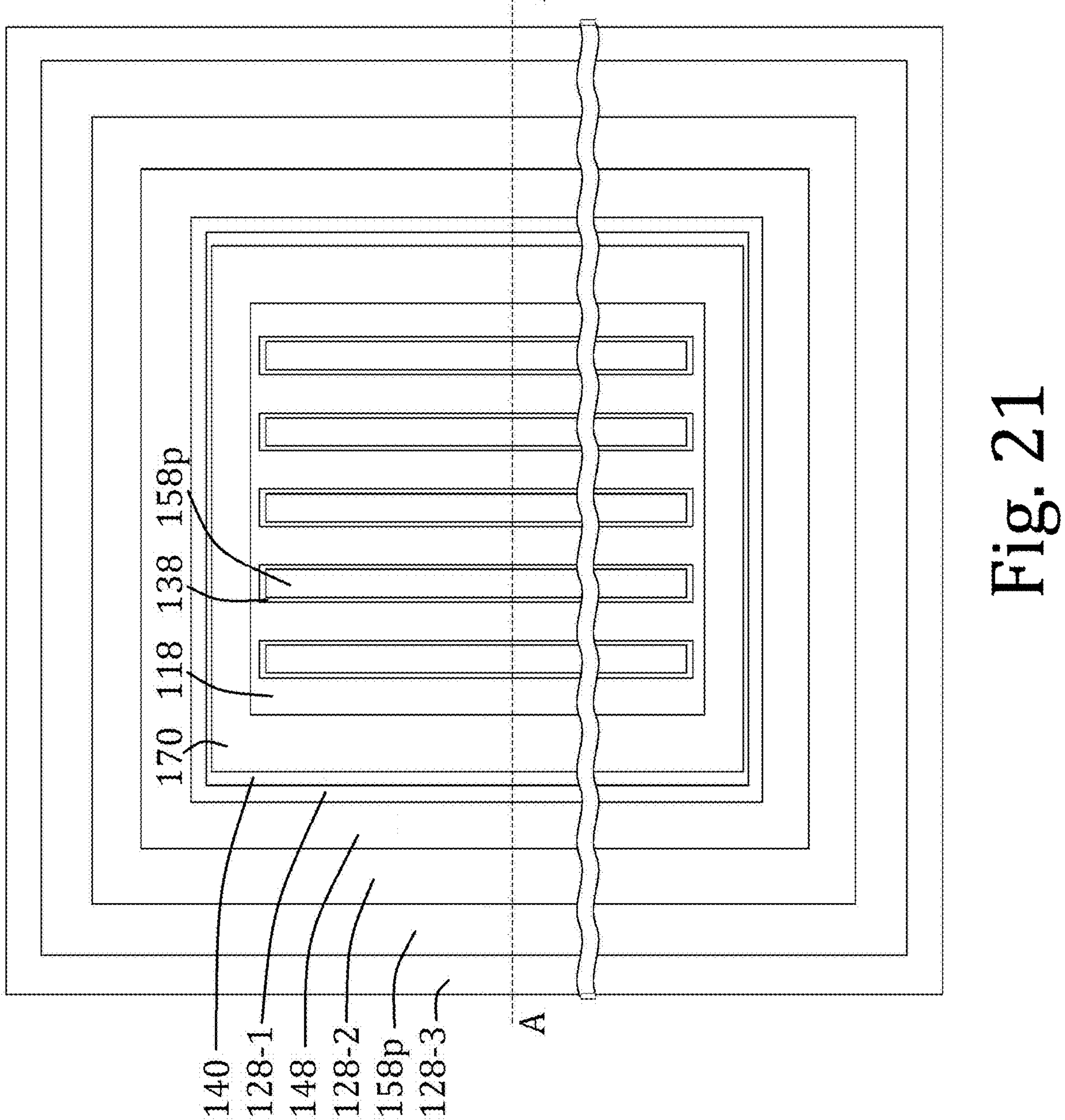

In FIG. 21, a top down view of the structure of FIG. 20 is provided, FIG. 20 being a cross-sectional view along the reference line A-A of FIG. 21. The view of FIG. 21 is similar to that of FIG. 18, except the protection structure 170 is formed. As illustrated in FIG. 21, the interface between the first STI region 128-1 and the adjacent edge+ wells 158*p/n* and/or boundary p-wells 138*b* has been covered by the protection structure 170.

Figure 22:
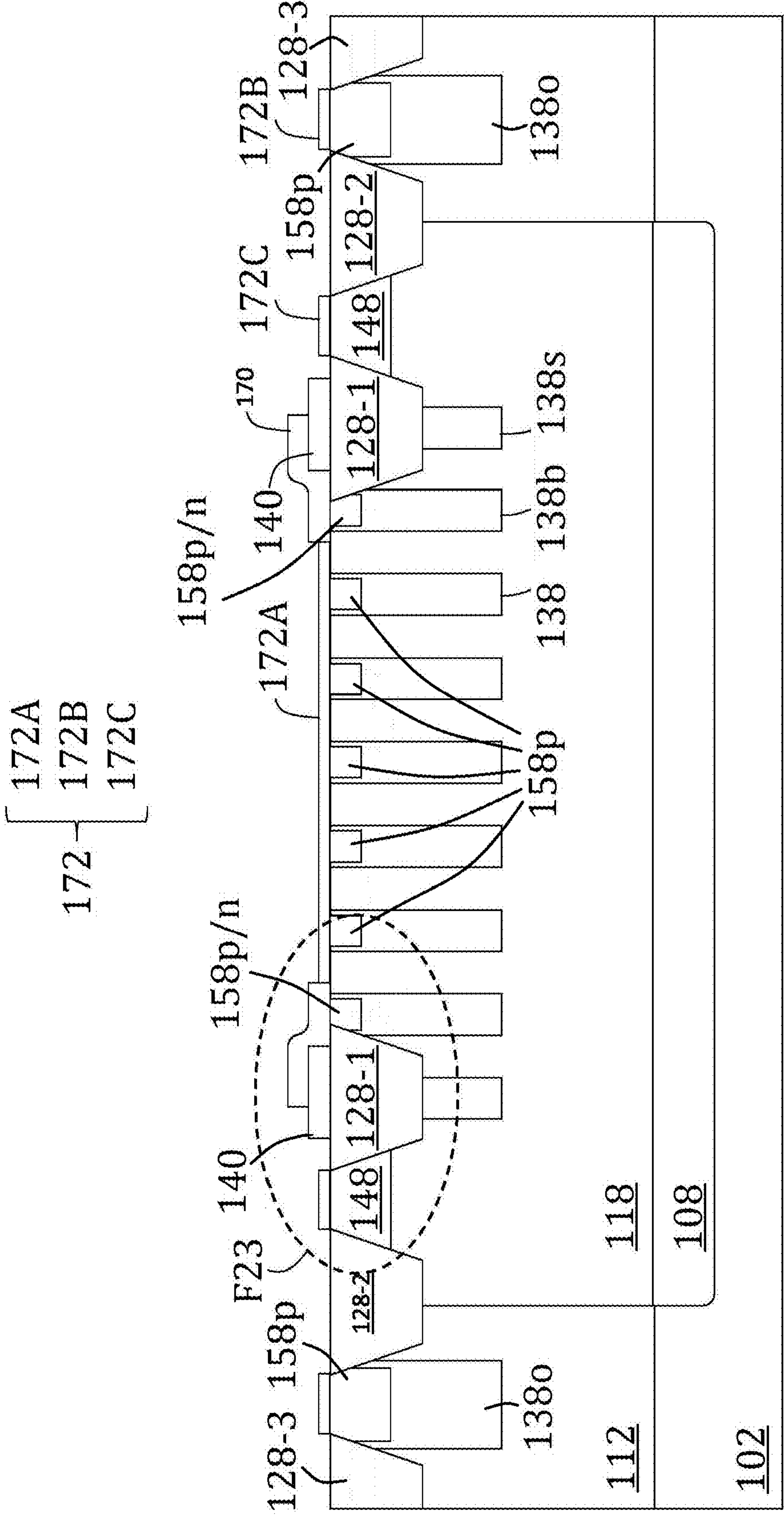

In FIG. 22, a silicide layer 172 is formed on the exposed surfaces of the semiconductor material of the second semiconductor layer 112, as modified with the various wells (p-wells 158*p*, p-wells 138, n-wells 148, edge+ wells 158*p/n*, and deep wells 118) thereby forming an anode 172A, a cathode 172C, and a bulk contact 172B. In some embodiments, the anode 172A is formed on the inner portion of the deep well 118 and on the p+ wells 158*p* and the p-wells 138. In some embodiments, the cathode 172C is formed on the n+ wells 148. In some embodiments, the bulk contact 172B is formed on the p+ wells 158*p* which are outside the second STI regions 128. In some embodiments, the silicide layer 172 may include cobalt silicide, titanium silicide, tungsten silicide, nickel silicide, or the like. An example process which may be used for forming the silicide layer 172 includes forming a metal-containing layer (not shown) to cover the exposed surfaces of the semiconductor material of the second semiconductor layer 112, as modified with the various wells. The metal-containing layer may be made by a blanket deposition such that it also covers the protection structure 170 and/or cap 140. The metal-containing layer may include cobalt, titanium, tungsten, nickel or a combination thereof. An annealing process is performed on the metal-containing layer to cause reaction of the metal with silicon in the second semiconductor layer 112 (as modified with the various wells) to form a silicide material of the silicide layer 172. Portions of the metal-containing layer on the cap 140 and protection structure 170 are removed after the silicide layer 172 is formed. In some embodiments, portions of the metal-containing layer which may remain over the silicide layer 172 which are unreacted may also be removed, for example, by etching and/or cleaning processes.

Figure 23A:
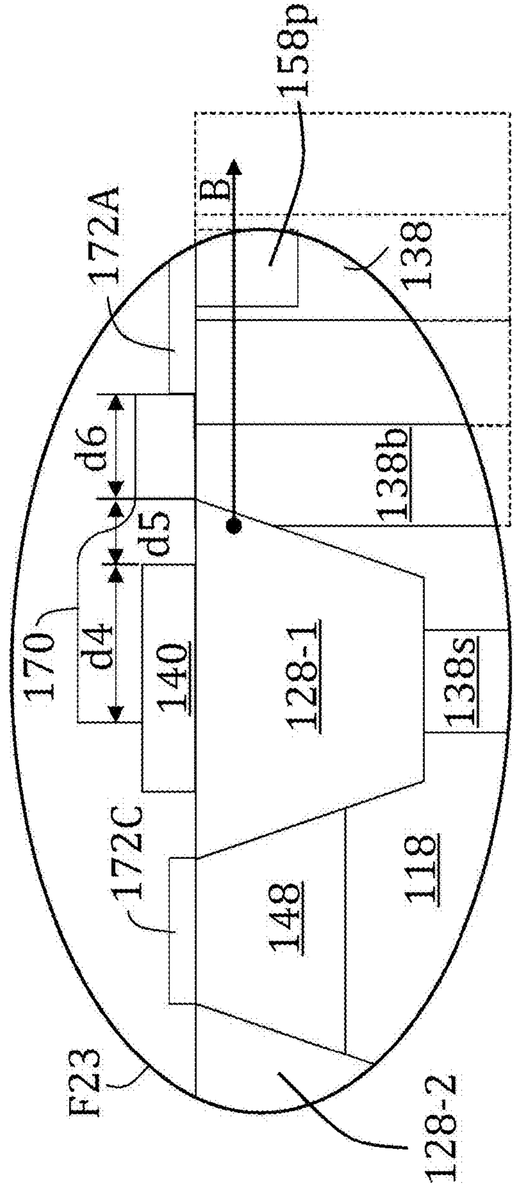
FIGS. 23A, 23B, 23C, 23D, and 23E include enlarged views of an area of FIG. 22 and illustrate detailed views of various configurations of the SBD, and FIGS. 23A, 23B, and 23C include graphs of concentrations of impurities in different regions of the SBD, in accordance with some embodiments.
Figure 23A:
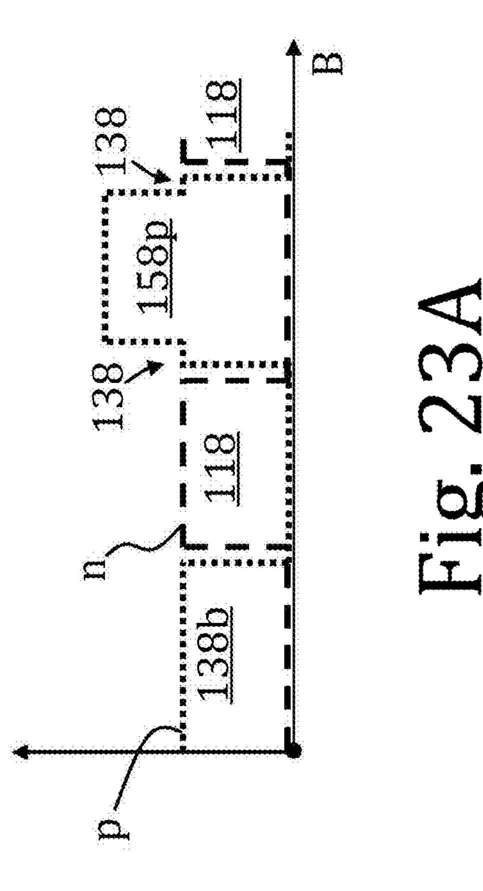
Figure 23B:
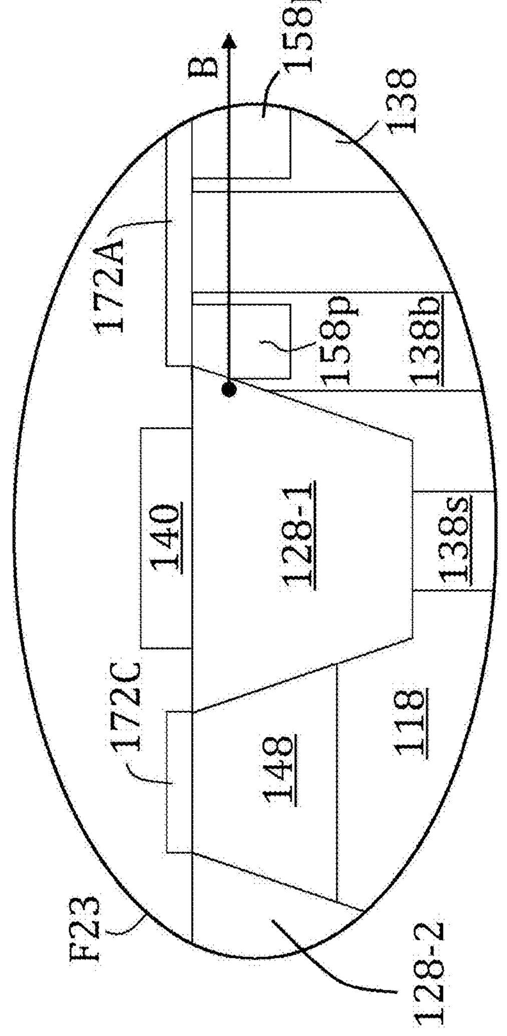
Figure 23B:
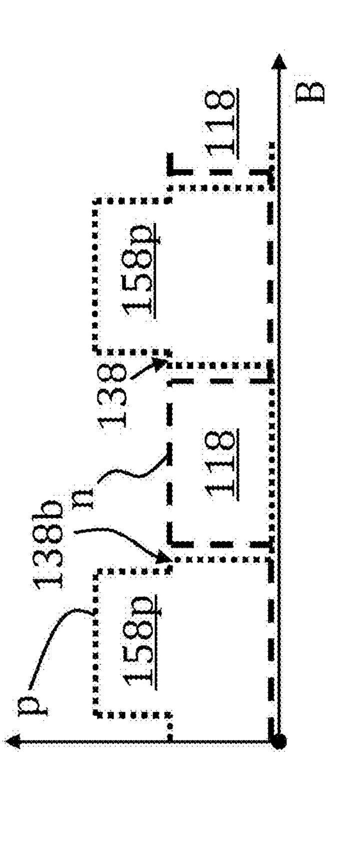
Figure 23C:
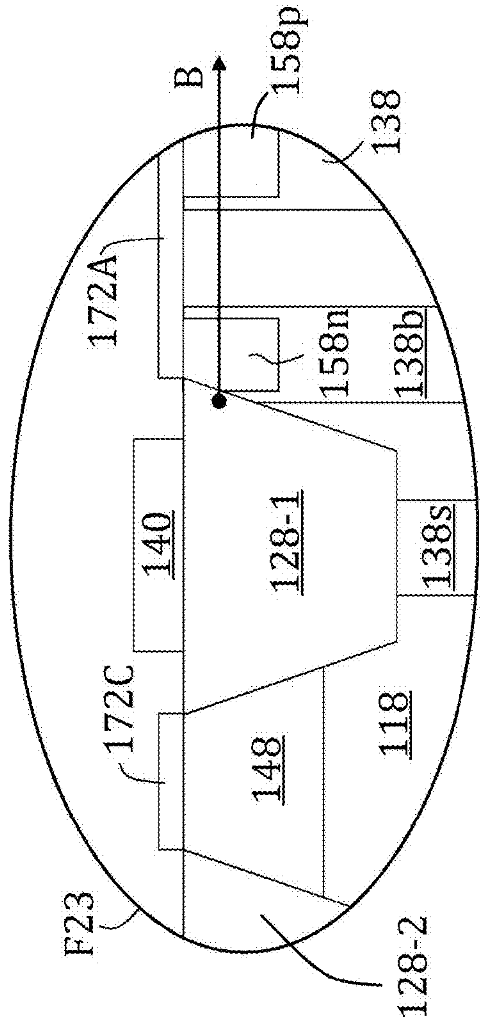
Figure 23C:
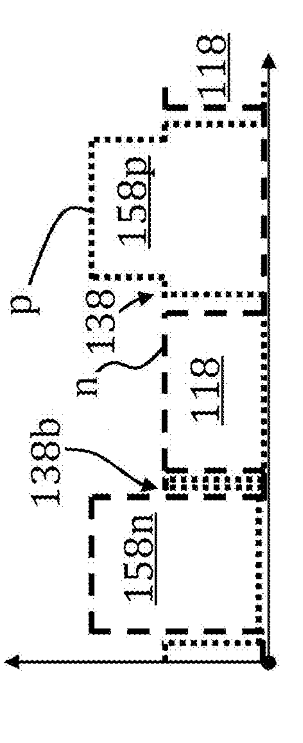
Figures 23D, 23E:
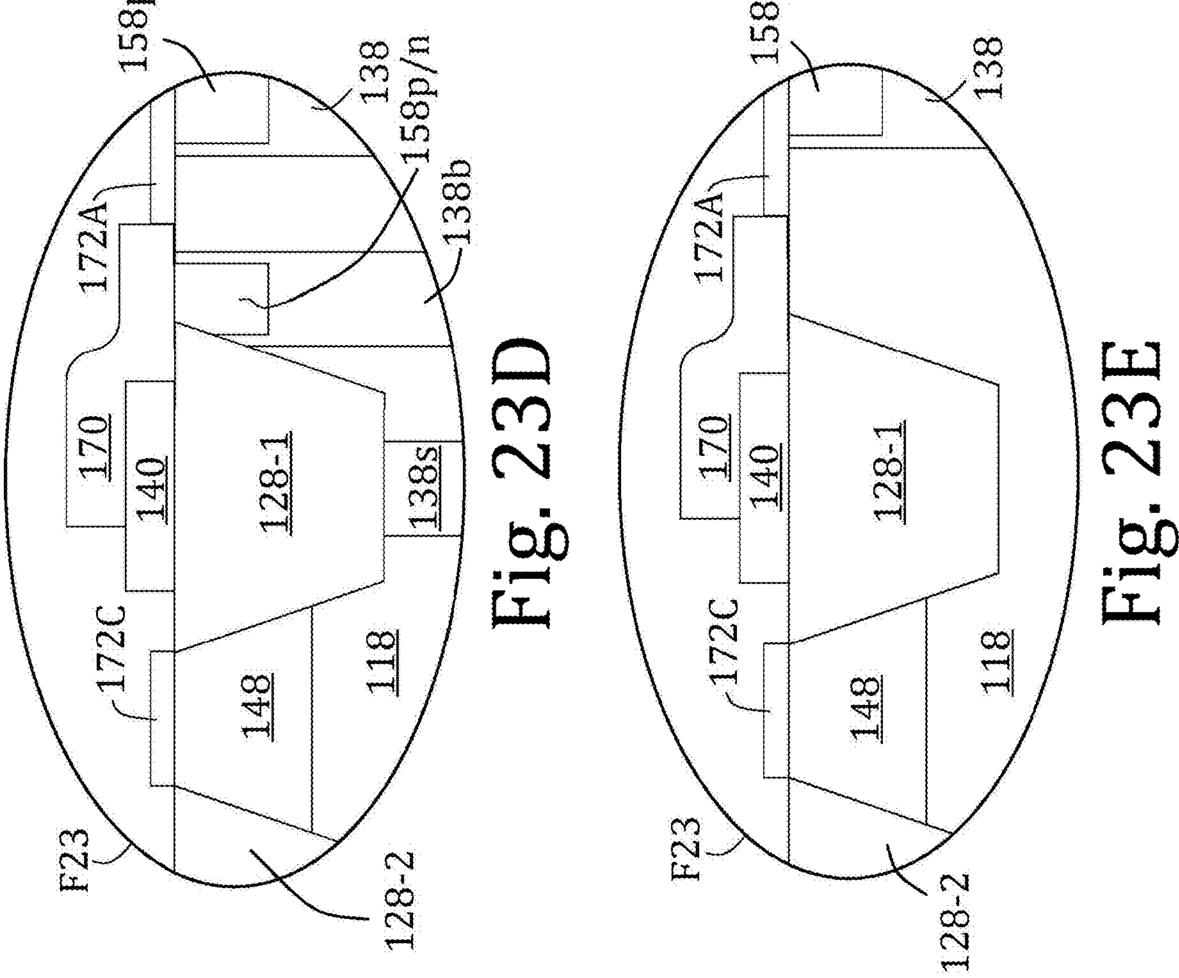

FIGS. 23A, 23B, 23C, 23D, and 23E include enlarged views of the dashed oval F23 of FIG. 22, in accordance with various embodiments. FIGS. 24A, 24B, 24C, 24D, and 24E also include enlarged views which are respectively similar to FIGS. 23A, 23B, 23C, 23D, and 23E, but which omit the cap 140, in accordance with some embodiments. FIG. 23A illustrates an embodiment which includes the boundary p-well 138 and the protection structure 170. FIG. 23B illustrates an embodiment which includes a p+ well 158*p* in the boundary p-well 138*b*, but omits the protection structure 170. FIG. 23C illustrates an embodiment which includes an n+ well 158*n* in the boundary p-well 138*b* and omits the protection structure 170. FIG. 23D illustrates an embodiment which includes both the edge+ well 158*p/n* (either the p+ well 158*p* or *n*+ well 158*n*) and the protection structure 170. FIG. 23E illustrates an embodiment which utilizes the protection structure 170 and omits the boundary p-well 138*b*. FIG. 23E also reminds through illustration that the sub p-well 138*s* may also be omitted for any of these embodiments.

Turning back to FIGS. 23A, 23B, and 23C, these Figures each include an arrow B overlaid on the oval F23 which indicates a starting point and direction for the x-axis of the graph respectively displayed beneath the oval F23. The arrow B is likewise overlaid on the x-axis of each of the graphs. The x-axis or B-axis therefore represents the position along the arrow B within the structure as depicted in the oval F23. Of course, it should be appreciated that the structure depicted in the oval F23 continues outside the oval F23 as shown in FIG. 22 and indicated by the dashed lines in FIG. 23A. The dashed lines are shown in FIG. 23A as an example because the x-axis in each of the graphs in FIGS. 23A, 23B, and 23C extends somewhat beyond the bounds of the oval F17. The y-axis of each of the graphs represents an effective percentage concentration of activated impurities or dopants of the various wells which are formed in the second semiconductor layer 112 using the processes and materials set forth above. It should be noted that the concentration where the B-axis crosses the y-axis is not necessarily zero, but primarily shows the effective dopant concentrations as relationships of concentrations of activated impurities relative to each other. In particular, counter doping processes that follow prior doping processes can push down the previously implanted dopants so that the concentration of the previous dopants becomes negligible.

In the graph of FIG. 23A, starting at the y-axis along the arrow B (or B-axis), it can be seen that the concentration of p-type impurities is higher in the boundary p-well 138*b* than the concentration of n-type impurities. Then, the concentration of n-type impurities is higher in the deep well 118 than the concentration of p-type impurities in the deep well 118. Then, a shoulder of p-type impurities can be seen for the p-well 138 followed immediately by an increase of p-type impurities in the p+ well 158*p* and then a second shoulder of p type impurities in the p-well 138. The concentration of p-type impurities is higher than the concentration of n-type impurities. Then, in the deep well 118, the concentration of n-type impurities is higher than the concentration of p-type impurities.

In the graph of FIG. 23B, starting at the y-axis along the arrow B (or B-axis), it can be seen that the effective concentration of p-type impurities is higher in the boundary p-well 138*b* than the concentration of n-type impurities. A shoulder of the boundary p-well 138*b* can be seen on either side of the p+ well 158*p*. Then, the concentration of n-type impurities is higher in the deep well 118 than the concentration of p-type impurities in the deep well 118. Then, another shoulder of p-type impurities can be seen for the p-well 138 followed immediately by an increase of p-type impurities in the p+ well 158*p* and then a second shoulder of p type impurities in the p-well 138. The concentration of p-type impurities is higher than the concentration of n-type impurities. Then, in the deep well 118, the concentration of n type impurities is higher than the concentration of p-type impurities.

In the graph of FIG. 23C, starting at the y-axis along the arrow B (or B-axis), it can be seen that the concentration of p-type impurities is higher in the boundary p-well 138*b* than the concentration of n-type impurities. A shoulder of the boundary p-well 138*b* can be seen on either side of the n+ well 158*n*. The n+ well 158*n* shows that the concentration of n-type impurities is higher than the n-type impurities in the deep well 118. Then, the concentration of n-type impurities is higher in the deep well 118 than the concentration of p-type impurities in the deep well 118. Then, another shoulder of p-type impurities can be seen for the p-well 138 followed immediately by an increase of p-type impurities in the p+ well 158*p* and then a second shoulder of p type impurities in the p-well 138. The concentration of p-type impurities is higher than the concentration of n-type impurities. Then, in the deep well 118, the concentration of n type impurities is higher than the concentration of p-type impurities.

As indicated in FIG. 23A, the overall width of the protection structure 170 is the combined distances d4, d5, and d6. The overall width of the protection structure 170 may be between about 500 nm to about 1500 nm, although other values may be used. The distance d4 may be between about 150 nm to about 600 nm, the distance d5 may be between about 100 nm and about 300 nm, and the distance d6 may be between about 150 nm and about 600 nm. In some embodiments, the distance d6 may not necessarily extend beyond the edge p-well 138*b*. These distances may be used for any of the embodiments utilizing the protection structure 170 over the cap 140.

In embodiments utilizing the protection structure 170, due to the protection structure 170, the anode 172A of the silicide layer 172 is laterally separated from the first STI region 128-1 by the distance d6. This separation reduces the leakage current from the anode 172A when reversed biased which could otherwise leak between the first STI region 128-1 and the deep well 118 (or boundary p-well 138*b* or edge+ well 158*p/n*).

In embodiments which do not use the protection structure 170, the edge+ well 158*p/n* may be used to improve device performance. When the edge+ well 158*p/n* is a p+ well 158*p*, the p+ well 158*p* has an interface with the sidewall of the first STI region 128-1. As such, the p+ well 158*p* inhibits leakage current from the anode 172A down the interface of the first STI region 128-1 and the p+ well 158*p* when reverse biased. When the edge+ well 158*p/n* is an n+ well 158*n*, the n+ well 158*n* has an interface with the sidewall of the first STI region 128-1. As such, the n+ well 158*n* improves Ion performance of the resulting diode to the anode 172A when forward biased. The n+ well 158*n* may be combined with the protection structure 170 to both improve Ion performance and reduce leakage current when reversed biased. leakage current from the anode 172A down the interface of the first STI region 128-1 and the p+ well 158*p*. The p+ well 158*p* may be combined with the protection structure 170 to further improve performance by reducing current leakage when reverse biased.

In some embodiments, the current leakage can be reduced by about a factor of 1000 (give or take 50%). For example, whereas leakage current was measured at about 1 μA in one unmodified SBD device, an otherwise identically designed SBD with the protection structure 170 and the edge p+ well 158*p* demonstrated a leakage current of about 1 nA under matching conditions. This improvement further realizes dramatically improved yield by about 35% and reduced power consumption, which is a benefit for use in mobile or other battery powered devices, since the power savings passes on to increased battery life or margin for increased performance.

Figures 24A, 24B:
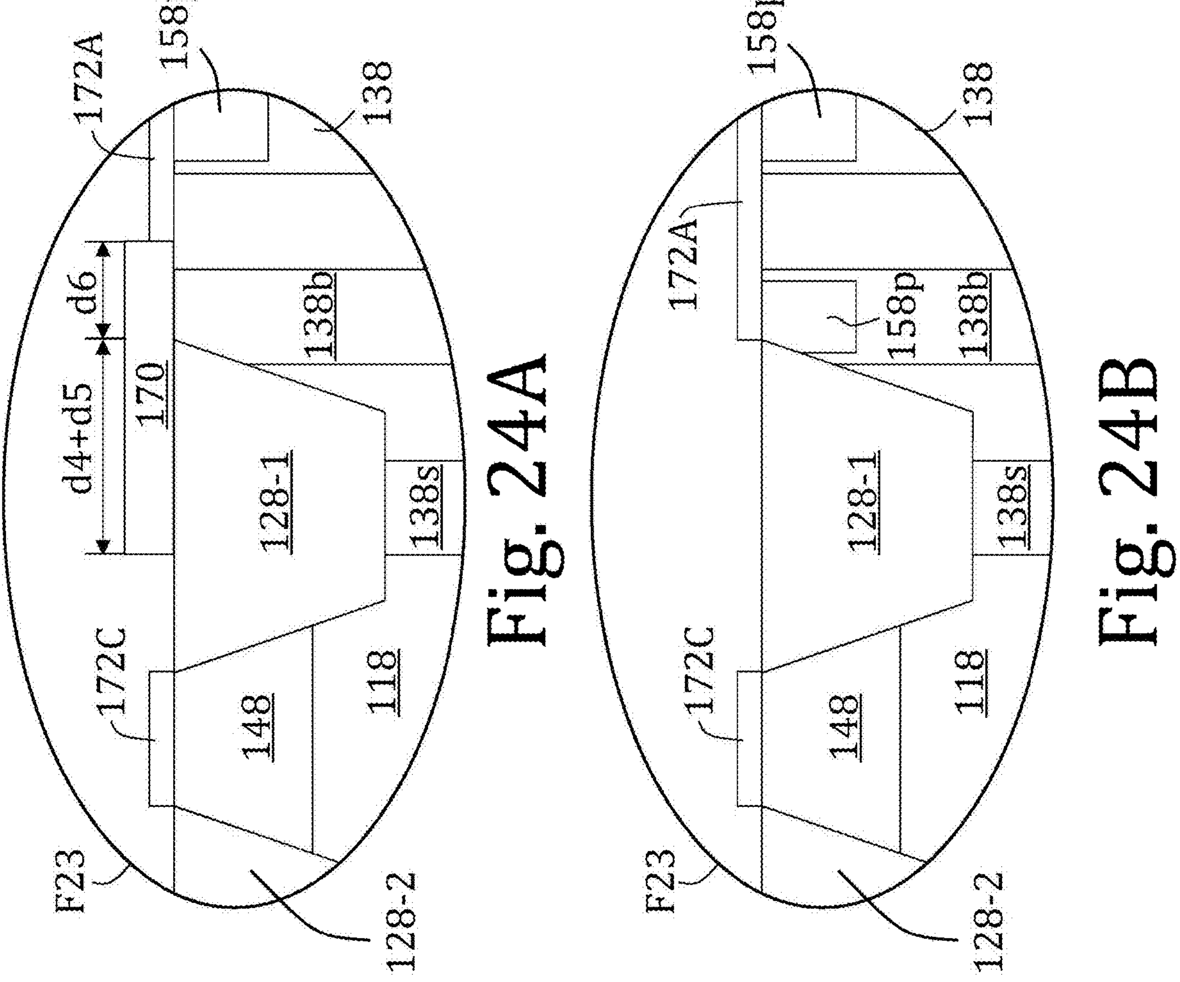
FIGS. 24A, 24B, 24C, 24D, and 24E include enlarged views of an area of FIG. 22 and illustrate detailed views of various configurations of the SBD where a cap is omitted, in accordance with some embodiments.
Figures 24C, 24D:
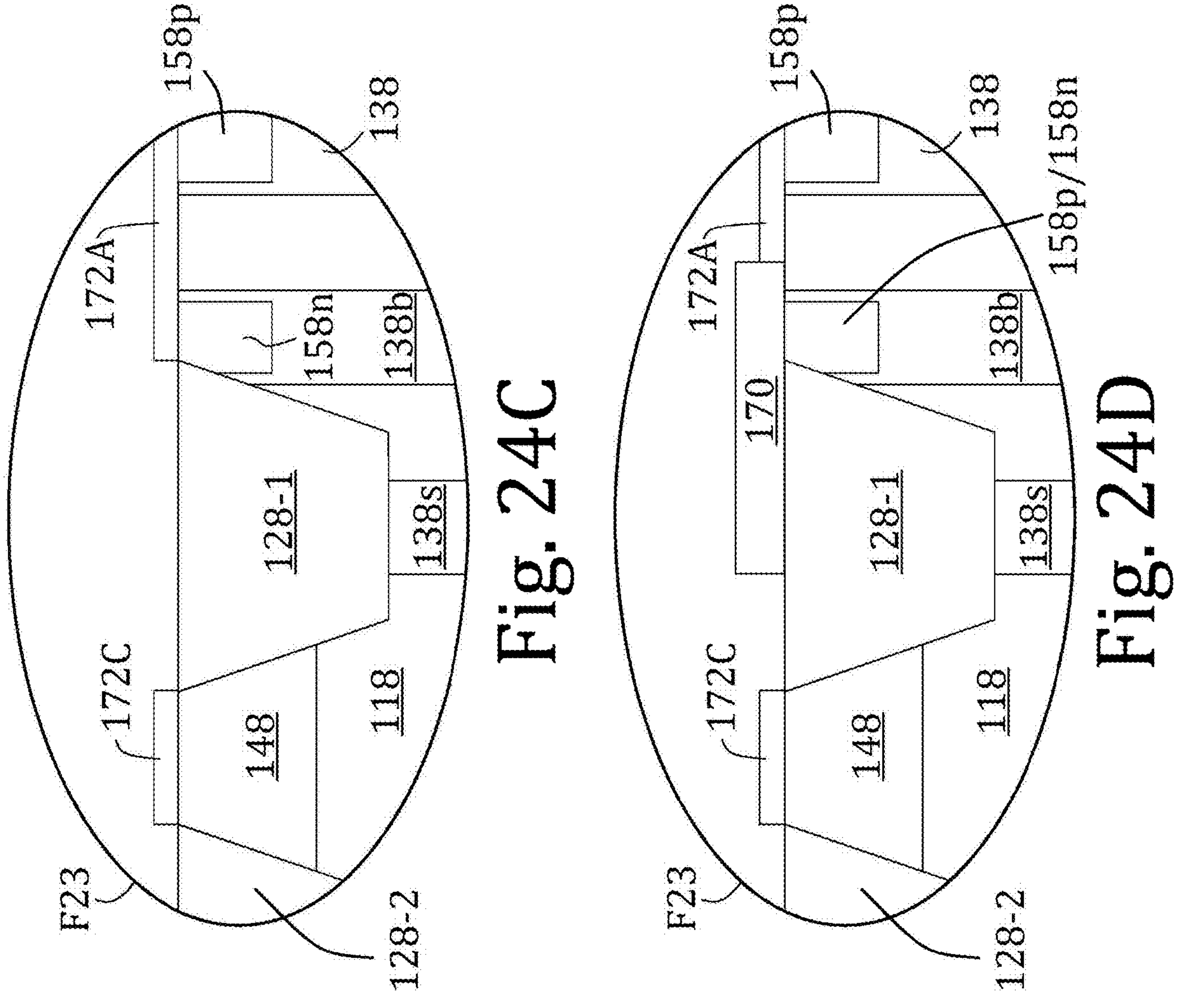
Figure 24E:
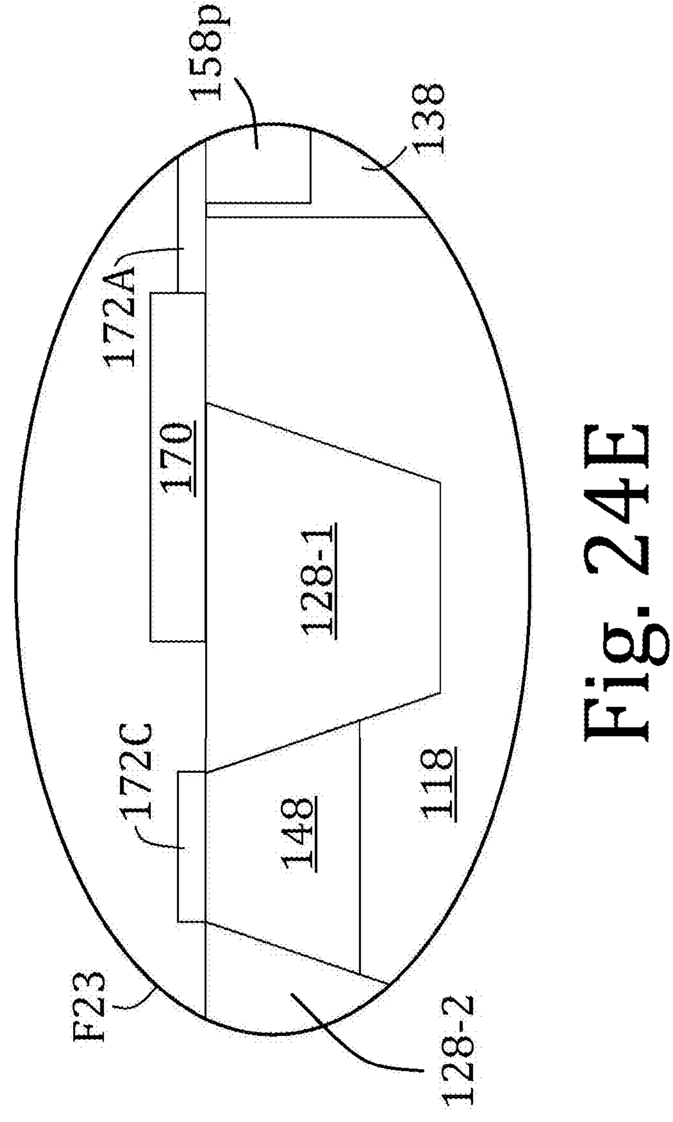

FIGS. 24A, 24B, 24C, 24D, and 24E illustrate like views according to FIGS. 23A, 23B, 23C, 23D, and 23E, with the exception that the cap 140 is omitted. The impurity concentration graphs for FIGS. 24A, 24B, and 24C are omitted as they are the same as those respectively illustrated in FIGS. 23A, 23B, and 23C. Further, the dimensions of the protection structure 170 of FIG. 23A are transferrable to the protection structure 24A by adding the dimension d4 and d5 for a portion of the protection structure 170 over the first STI region 128-1.

Figure 25:
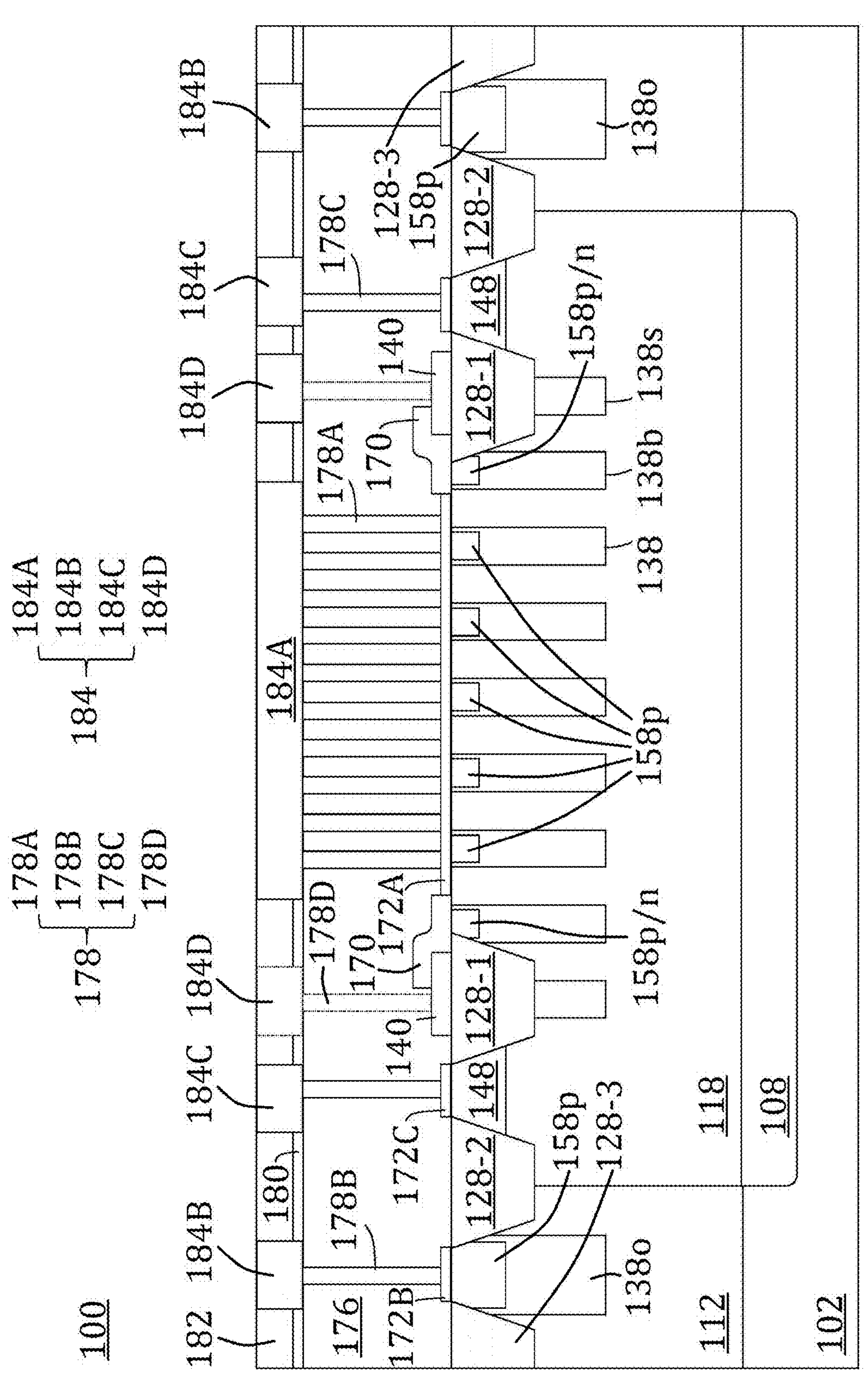
FIG. 25 is a cross-sectional view of the SBD based on the FIGS. 23A, 23B, 23C, 23D, and 23E, in accordance with some embodiments.
Figure 26:
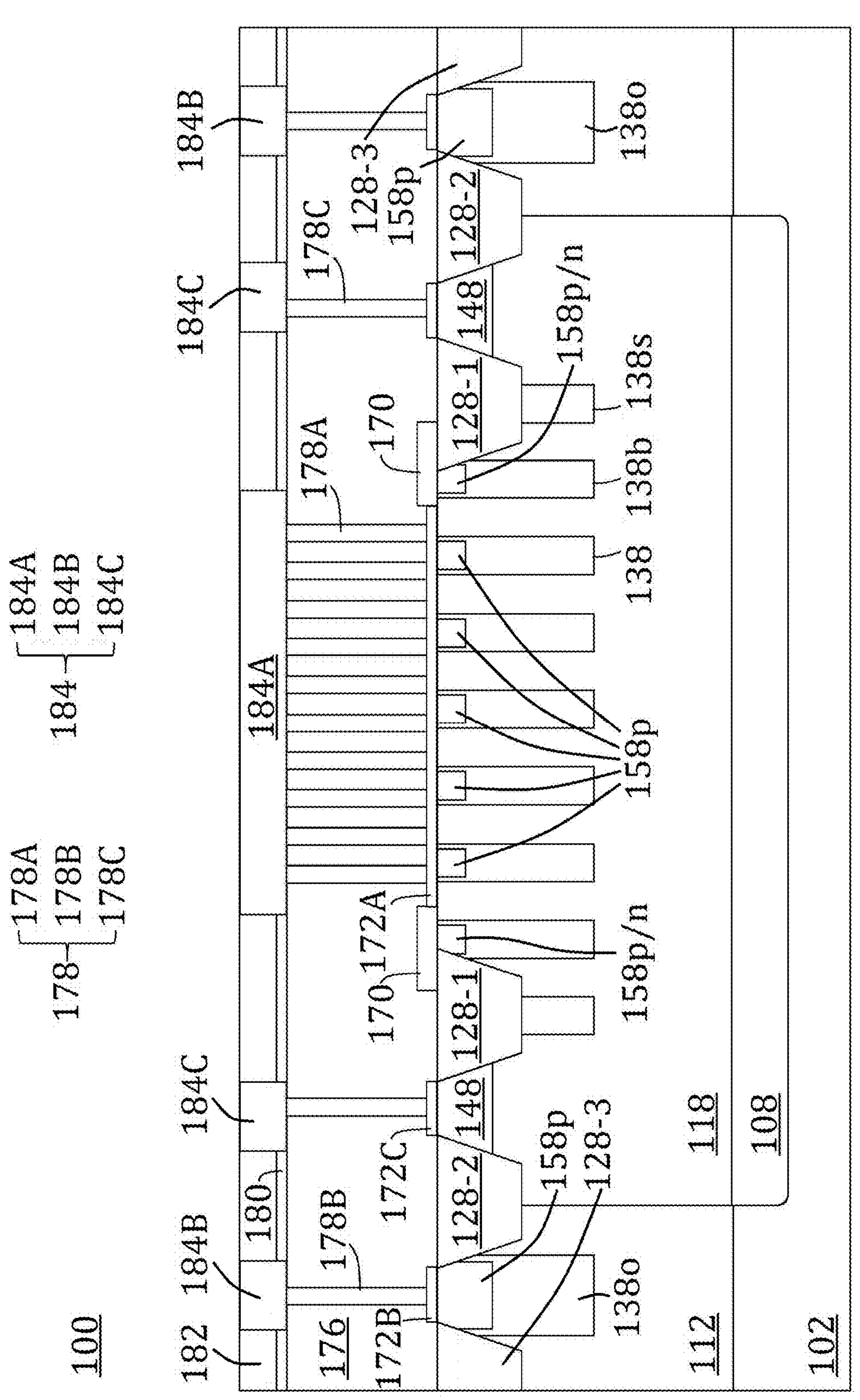
FIG. 26 is a cross-sectional view of the SBD based on the FIGS. 24A, 24B, 24C, 24D, and 24E, in accordance with some embodiments.

FIGS. 25 and 26 include views of an SBD device 100 after contacts have been formed to the silicide layer 172. FIG. 25 is an SBD device 100 which include the cap 140 and FIG. 26 is an SBD device 100 which omits the cap 140. The views of FIGS. 25 and 26 include a combined view of the protection structure 170 and the edge+ wells 158*p/n*. It should be understood that these may be included, omitted, and configured in accordance with the various embodiments described above.

A dielectric layer 176 is disposed over the silicide layer 172, over the cap 140 (if used), over the protection structure 170 (if used), and over the STI regions 128. The dielectric layer 176 may be any suitable material, such as silicon glass (which may be doped (PSG or BSG) or undoped) or the like, and which may be formed by any suitable deposition technique, such as flowable CVD, PVD, or spin coat.

Through-dielectric vias (TDVs) 178 are disposed within the dielectric layer 176 and contact the silicide layer 172 to electrically and physically connect the silicide layer 172 to overlying contact features 184. In particular the TDVs 178A contact the anode 172A, the TDVs 178C contact the cathode 172C, the TDVs 178B contact the bulk contact 172B, and the optional TDVs 178D contact the cap 140. As an example for forming the TDVs 178, the dielectric layer 176 may be photoetch patterned to form openings corresponding to each of the TDVs 178, a seed layer (not separately shown) deposited in the openings, and then a conductive fill plated on the seed layer. The upper surfaces of the dielectric layer 176 and TDVs 178 may be leveled so that they are substantially coplanar within process variations. The TDVs 178 may be formed of any suitable conductive material, including for example, aluminum, copper, titanium, tungsten, cobalt, gold, silver, and so forth, or alloys thereof. In one embodiment, the plugs may be formed of tungsten. In another embodiment, a seed layer may be formed of titanium layer and a copper layer over the titanium layer, and the conductive fill may be formed of copper. As indicated in FIGS. 25 and 26, in some embodiments, the anode 172A may have several TDVs 178A contacting it which may be arranged in an array or matrix. The cathode 172C may likewise have an array of TDVs 178A extending along the length of the cathode 172C. It should be understood that the TDVs 178 may be formed by other processes. For example, in some embodiments, the TDVs 178 may be formed before depositing the dielectric layer 176 by depositing a seed layer on the silicide layer 172, forming a mask (not shown) over the silicide layer 172 and patterning it to form openings according to the locations of the TDVs 178, plating the conductive fill on the seed layer, removing the mask, etching remaining exposed portions of the seed layer, depositing the dielectric layer 176, and planarizing the dielectric layer and TDVs 178 to level their upper surfaces.

An etch stop layer 180 may be interposed between the dielectric layer 176 and a second dielectric layer 182. The etch stop layer 180 provides an etch stop for forming openings in the second dielectric layer 182 without damaging the dielectric layer 176. Alternatively, the etch stop layer 180 may be omitted and the materials for the dielectric layer 176 and dielectric layer 182 be selected to have good etch selectivity therebetween so that etching the second dielectric layer 182 does not inadvertently etch the dielectric layer 176. The etch stop layer 180 may be formed of any suitable material, such as silicon nitride, silicon carbide, and so forth, by any suitable deposition process, such as by PVD, CVD, or spin coating. The second dielectric layer 182 may be formed of any suitable material using any suitable technique, such as those discussed above with respect to the dielectric layer 176. In some embodiments, the second dielectric layer 182 may be formed of a same material as the dielectric layer 176, while in other embodiments, it may be formed of a different material. For example, in one embodiment the dielectric layer 176 may be PSG and the second dielectric layer 182 may be FSG or vice versa.

The conductive features 184 may include metal lines, metal contacts, and the like and are disposed in the second dielectric layer 182. They may be formed using processes and materials similar to those discussed above with respect to the TDVs 178. For example, the conductive features 184 may be deposited by forming a mask (not shown) over the second dielectric layer 182, patterning the mask, and using the mask to etch the second dielectric layer 182 to form openings corresponding to the conductive features 184. Then, the conductive features 184 may be formed in the openings. The conductive features 184 may be formed of any suitable materials using any suitable processes. In embodiment, a seed layer may be deposited in the openings and a plating process used to form an upper portion of the conductive features 184 on the seed layer. In some embodiments, a planarization process may be used to level upper surfaces of the conductive features 184 with the upper surfaces of the second dielectric layer 182.

The conductive features 184 include first conductive features 184A, second conductive features 184B, third conductive features 184C, and (in FIG. 25) fourth conductive features 184D. The first conductive features 184A are coupled to the anode 172A, the second conductive features 184B may optionally be formed to be coupled to the bulk contact 172B (for example, to provide substrate biasing or grounding), the third conductive features 184C are coupled to the cathode 172C, and the fourth conductive features 178D may optionally be formed to be coupled to the cap 140. The cap 140 may be grounded byway of the fourth conductive features 178D, for example, to help disperse stray electrical signals or potentials.

The resulting SBD device 100 may be used in place of current SBD devices 100 while gaining improved device performance. Embodiments advantageously provide an SBD device 100 which has a JBS structure with a current blocking feature at the boundaries or edges between the depletion region (e.g., under the anode) and the STI region surrounding the depletion region. The current blocking feature may include a protection structure which overlaps the interface between the STI region and the area under the anode, which inhibits current from leaking to the interface and also sets apart a silicide region over the depletion region from the STI region. The SBD device may also include in addition to or instead of the protection structure, a high dosage implant region in contact with the side wall of the STI region (i.e., the STI region interface). The high dosage implant may be of the same conductivity (e.g., p-type) as JBS wells (e.g., p-type) disposed in a deep well of opposite conductivity (e.g., n-type). In such instances, the high dosage implant also provides current blocking. As such, the high dosage implant may serve as the current blocking feature or may serve along with the protection structure as the current blocking feature. The high dosage implant may be of the opposite conductivity (e.g., n-type) as JBS wells (e.g., p-type) disposed in a deep well of the same conductivity (e.g., n-type). In such instances, the high dosage implant also provides improved Ion for the SBD device. As such, the high dosage implant may serve along with the protection structure to provide improved both Ion and Ioff conditions. Embodiments also contemplate a variation which also includes a cap on the STI region, where the protection structure may overlap the cap. As a result, Ioff is improved and yield is improved. Optionally, Ion is also improved.

One embodiment is a method including forming a first well of a first conductivity type in a second well of a second conductivity type, the first well contacting a sidewall of a shallow trench isolation (STI) structure. The method also includes depositing a protection structure overlapping the first well and an upper surface of the STI structure. The method also includes and forming a first silicide over the first well and the second well, the first silicide corresponding to a first contact of a Schottky barrier diode (SBD), the first silicide separated from the STI structure by the protection structure. In an embodiment, the method may include, prior to depositing the protection structure, depositing a cap structure over a portion of the STI structure, the protection structure extending over at least a portion of the cap structure, the STI structure, and the first well. In an embodiment, the method may include forming a third well at an upper surface of the first well, the third well having a higher concentration of dopant impurities than the first well. In an embodiment, the third well has the second conductivity type. In an embodiment, the method may include operating the SBD in a reverse bias condition, the third well inhibiting a flow of current from traveling through the first well to the second well. In an embodiment, the third well has sidewalls surrounded by the first well. In an embodiment, the method may include forming a fourth well in the second well, at a side opposite the STI structure from the first well, the fourth well having the second conductivity type, and forming a second silicide over the fourth well, the second silicide corresponding a second contact of the SBD. In an embodiment, the method may include operating the SBD in a reverse bias condition, a flow of current inhibited by the protection structure. In an embodiment, the first silicide has a width which is less than a distance between a first portion of the STI structure and a second portion of the STI structure, the second portion at an opposite side of the first silicide than the first portion. In an embodiment, the method may include forming a buried layer below the second well, the buried layer implanted with the second conductivity type.

Another embodiment is a Schottky barrier diode (SBD) device, the SBD device including a first well of a first conductivity type disposed in a deep well of a second conductivity type, the first well disposed between two opposing portions of a shallow trench isolation (STI) region. The device also includes a second well of the first conductivity type disposed in the deep well, the second well parallel to the first well, the second well contacting the STI region. The device also includes a first high-dosage well of the first conductivity type disposed at an upper surface of the first well, the first high-dosage well having a higher concentration of impurities of the first conductivity type than the first well. The device also includes a second high-dosage well disposed an upper surface of the second well. The device also includes a third well of the second conductivity type disposed outside the STI region and within the deep well, the third well having a greater concentration of impurities of the second conductivity type than the deep well. The device also includes a silicide disposed over the first well and over the deep well between the two opposing portions of the STI region. In an embodiment, the second high-dosage well is of the first conductivity type. In an embodiment, the SBD device may include a protection structure overlapping the STI region and the second high-dosage well, a sidewall of the silicide coinciding with a sidewall of the protection structure. In an embodiment, the SBD device may include a capping structure disposed over the STI region, the protection structure further overlapping the capping structure. In an embodiment, the capping structure may include polysilicon.

Another embodiment is a structure including a buried layer, the buried layer having an x-type conductivity, where x is either n or p. The structure also includes a semiconductor layer disposed over the buried layer. The structure also includes a deep x-well disposed in the semiconductor layer. The structure also includes a set of y-wells disposed in the semiconductor layer in the deep x-well, where y is either n or p and is different from x, each y-well of the set of y-wells containing a y+ well at an upper surface thereof. The structure also includes a shallow trench isolation (STI) structure disposed in the semiconductor layer in the deep x-well, the set of y-wells disposed between a first portion of the STI structure and a second portion of the STI structure, the first portion of the STI structure and the second portion of the STI structure on opposing sides of the set of y-wells. The structure also includes a current limiting feature disposed between the set of y-wells and the first portion of the STI structure, the current limiting feature inhibiting current from reaching the first portion of the STI structure. In an embodiment, the structure may include a first y-well disposed in the semiconductor layer in the deep x-well between the set of y-wells and the first portion of the STI structure, the first y-well contacting the first portion of the STI structure. In an embodiment, the current limiting feature includes a y+ well disposed at an upper surface of the first y-well, within the y-well. In an embodiment, the current limiting feature includes a protection structure overlapping an interface between the first portion of the STI structure and the semiconductor layer. In an embodiment, the structure may include: a first y-well disposed in the semiconductor layer in the deep x-well between the set of y-wells and the first portion of the STI structure; and a first x+ well disposed in the first y-well, the first x+ well contacting the first portion of the STI structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first well of a first conductivity type in a second well of a second conductivity type, the first well contacting a sidewall of a shallow trench isolation (STI) structure;

after forming the first well, depositing a protection structure overlapping the first well and an upper surface of the STI structure; and after depositing the protection structure, forming a first silicide over the first well and the second well, the first silicide corresponding to a first contact of a Schottky barrier diode (SBD), the first silicide separated from the STI structure by the protection structure.

2. The method of claim 1, further comprising:

prior to depositing the protection structure, depositing a cap structure over a portion of the STI structure, the protection structure extending over at least a portion of the cap structure, the STI structure, and the first well.

3. The method of claim 1, further comprising:

forming a third well at an upper surface of the first well, the third well having a higher concentration of dopant impurities than the first well.

4. The method of claim 3, wherein the third well has the second conductivity type.

5. The method of claim 3, further comprising:

operating the SBD in a reverse bias condition, the third well inhibiting a flow of current from traveling through the first well to the second well.

6. The method of claim 3, wherein the third well has sidewalls surrounded by the first well.

7. The method of claim 1, further comprising:

forming a fourth well in the second well, at a side opposite the STI structure from the first well, the fourth well having the second conductivity type; and forming a second silicide over the fourth well, the second silicide corresponding to a second contact of the SBD.

8. The method of claim 1, further comprising:

operating the SBD in a reverse bias condition, a flow of current inhibited by the protection structure.

9. The method of claim 1, wherein the first silicide has a width which is less than a distance between a first portion of the STI structure and a second portion of the STI structure, the second portion at an opposite side of the first silicide than the first portion.

10. The method of claim 1, further comprising:

forming a buried layer below the second well, the buried layer implanted with the second conductivity type.

11. A method comprising:

forming a first well of a first conductivity type in a substrate;

forming a shallow trench isolation (STI) in the first well;

forming a second well and a third well of a second conductivity type in the first well, the second well contacting a sidewall of the STI;

after forming the first well, the STI, the second well, and the third well, depositing a protection structure overlapping an upper surface of the second well and an upper surface of the STI; and after depositing the protection structure, forming a first silicide over the first well and the third well, the first silicide corresponding to a first contact of a Schottky barrier diode (SBD), the first silicide separated from the STI by the protection structure.

12. The method of claim 11, further comprising:

forming a fourth well at an upper surface of the second well, wherein the fourth well is of the first conductivity type or the second conductivity type; and forming a fifth well of the second conductivity type at an upper surface of the third well, wherein the fifth well has a greater concentration of impurities than the third well.

13. The method of claim 12, wherein the fourth well is of the first conductivity type.

14. The method of claim 12, wherein the fourth well is of the second conductivity type, wherein the fourth well has a greater concentration of impurities than the third well.

15. The method of claim 12, further comprising:

forming a sixth well of the first conductivity type in the first well, the sixth well having a greater concentration of impurities than the first well, wherein the sixth well is on an opposing side of the STI from the second well, wherein the sixth well contacts a sidewall of the STI.

16. The method of claim 12, further comprising:

forming a cap on the STI, wherein the protection structure overlaps an upper surface of the cap.

17. A method comprising:

forming a deep well of a first conductivity type;

forming a first shallow trench isolation (STI) region and a second STI region, wherein the deep well extends between the first STI region and the second STI region;

forming a first well of a second conductivity type in the deep well, the first well contacting the first STI region;

forming a second well of the second conductivity type in the deep well, the second well being parallel to the first well;

forming a third well of the first conductivity type in the deep well, the third well being between the first STI region and the second STI region, the third well having a higher concentration of impurities of the first conductivity type than the deep well;

forming a first high-dosage well at an upper surface of the first well;

forming a second high-dosage well at an upper surface of the second well, the second high-dosage well having a higher concentration of impurities of the second conductivity type than the third well; and forming a silicide disposed over the deep well and over the second high-dosage well.

18. The method of claim 17, wherein forming the first well and forming the first high-dosage well are performed simultaneously.

19. The method of claim 17, wherein forming the first high-dosage well and forming the second high-dosage well are performed simultaneously.

20. The method of claim 17, further comprising:

depositing a protection structure overlapping the first STI region and the first high-dosage well.

* * * * *